(12) United States Patent
Yun et al.

(10) Patent No.: US 11,723,208 B2
(45) Date of Patent: *Aug. 8, 2023

(54) MEMORY DEVICE

(71) Applicant: Samsung Electronics Co., Ltd., Suwon-si (KR)

(72) Inventors: Kyunghwa Yun, Hwaseong-si (KR); Pansuk Kwak, Seoul (KR); Chanho Kim, Seoul (KR); Dongku Kang, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/695,186

(22) Filed: Mar. 15, 2022

(65) Prior Publication Data

US 2022/0208784 A1 Jun. 30, 2022

Related U.S. Application Data

(63) Continuation of application No. 17/001,035, filed on Aug. 24, 2020, now Pat. No. 11,289,500, which is a
(Continued)

(30) Foreign Application Priority Data

Aug. 6, 2019 (KR) .................. 10-2019-0095526

(51) Int. Cl.
*G11C 11/00* (2006.01)
*H10B 43/40* (2023.01)
(Continued)

(52) U.S. Cl.
CPC .............. *H10B 43/40* (2023.02); *G11C 7/18* (2013.01); *G11C 16/08* (2013.01); *H10B 41/10* (2023.02);
(Continued)

(58) Field of Classification Search
CPC .................. G11C 7/18; G11C 16/08
See application file for complete search history.

(56) References Cited

U.S. PATENT DOCUMENTS 6,058,044 A 5/2000 Sugiura et al.
6,483,749 B1 11/2002 Choi et al.
(Continued)

FOREIGN PATENT DOCUMENTS

KR 10-0849715 8/2008

OTHER PUBLICATIONS

U.S. Appl. No. 16/814,491, Yun et al.
(Continued)

*Primary Examiner* — Pho M Luu
(74) *Attorney, Agent, or Firm* — Harness, Dickey & Pierce, P.L.C.

(57) ABSTRACT

A memory device comprises a peripheral circuit region including a first substrate and circuit elements on the first substrate, the circuit elements including a row decoder, and a memory cell region including a cell array region and a cell contact region, wherein the cell array region includes wordlines, stacked on a second substrate on the peripheral circuit region, and channel structures extending in a direction perpendicular to an upper surface of the second substrate and penetrating the wordlines, wherein the cell contact region includes cell contacts connected to the wordlines and on both sides of the cell array region in a first direction parallel to the upper surface of the second substrate, the cell contacts including a first cell contact region and a second cell contact region, the first and second cell contact regions having different lengths to each other in the first direction, wherein each of the first and second cell contact regions includes first pads having different lengths than each other in the first direction, and second pads different from the first
(Continued)

pads, wherein the cell contacts are connected to the wordlines in the first pads, wherein the number of the second pads included in the first cell contact region is greater than the number of the second pads included in the second cell contact region, and wherein the memory cell region includes a first metal pad and the peripheral circuit region includes a second metal pad, and the memory cell region and the peripheral circuit region are vertically connected to each other by the first metal pad and the second metal pad.

17 Claims, 32 Drawing Sheets

Related U.S. Application Data continuation-in-part of application No. 16/814,491, filed on Mar. 10, 2020, now Pat. No. 11,211,391.

(51) Int. Cl.
| | | |
|---|---|---|
| *G11C 16/08* | (2006.01) | |
| *G11C 7/18* | (2006.01) | |
| *H10B 41/10* | (2023.01) | |
| *H10B 41/27* | (2023.01) | |
| *H10B 41/35* | (2023.01) | |
| *H10B 41/41* | (2023.01) | |
| *H10B 43/10* | (2023.01) | |
| *H10B 43/27* | (2023.01) | |
| *H10B 43/35* | (2023.01) | |

(52) U.S. Cl.
CPC ............ *H10B 41/27* (2023.02); *H10B 41/35* (2023.02); *H10B 41/41* (2023.02); *H10B 43/10* (2023.02); *H10B 43/27* (2023.02); *H10B 43/35* (2023.02)

(56) References Cited

U.S. PATENT DOCUMENTS

| | | | |
|---|---|---|---|
| 9,202,581 B1 | 12/2015 | Kamei | |
| 9,412,749 B1 | 8/2016 | Shimabukuro et al. | |
| 9,570,446 B1 * | 2/2017 | Woo | H01L 24/09 |
| 9,577,085 B2 | 2/2017 | Lee | |
| 9,589,978 B1 | 3/2017 | Yip | |
| 9,806,093 B2 | 10/2017 | Toyama et al. | |
| 9,818,693 B2 | 11/2017 | Toyama et al. | |
| 9,818,759 B2 | 11/2017 | Kai et al. | |
| 9,941,209 B2 | 4/2018 | Tessariol et al. | |
| 9,953,992 B1 | 4/2018 | Ogawa et al. | |
| 9,985,048 B2 | 5/2018 | Lee | |
| 10,062,765 B2 | 8/2018 | Oh et al. | |
| 10,115,440 B2 | 10/2018 | Nguyen et al. | |
| 10,204,686 B2 | 2/2019 | Lee et al. | |
| 10,256,248 B2 | 4/2019 | Lu et al. | |
| 10,276,585 B2 | 4/2019 | Utsumi | |
| 10,373,673 B2 | 8/2019 | Shin et al. | |
| 10,879,196 B2 | 12/2020 | Hong et al. | |
| 11,289,500 B2 * | 3/2022 | Yun | H01L 27/1157 |
| 11,562,804 B2 * | 1/2023 | Park | G11C 29/42 |
| 2012/0257452 A1 | 10/2012 | Kim et al. | |
| 2015/0129878 A1 | 5/2015 | Shin et al. | |
| 2015/0340095 A1 | 11/2015 | Tanzawa | |
| 2017/0117182 A1 | 4/2017 | Lee | |
| 2017/0179153 A1 | 6/2017 | Ogawa et al. | |
| 2017/0263638 A1 | 9/2017 | Okada | |
| 2017/0330887 A1 | 11/2017 | Kim et al. | |
| 2018/0047744 A1 | 2/2018 | Utsumi | |
| 2018/0247953 A1 | 8/2018 | Lee | |
| 2021/0043639 A1 | 2/2021 | Yun et al. | |
| 2022/0077061 A1 * | 3/2022 | Liao | H01L 21/76849 |

OTHER PUBLICATIONS

Office action dated Apr. 22, 2021, for corresponding U.S. Appl. No. 16/814,491.

Notice of Allowance dated Aug. 13, 2021, for corresponding U.S. Appl. No. 16/814,491.

Office action dated Sep. 16, 2021, for corresponding U.S. Appl. No. 17/001,035.

German Office action dated Oct. 18, 2021, for corresponding DE Patent Application No. 102020107244.9.

* cited by examiner

MEMORY DEVICE

CROSS-REFERENCE TO RELATED APPLICATION(S)

The present application is a continuation of and claims priority under 35 U.S.C. § 120 to U.S. patent application Ser. No. 17/001,035, filed on Aug. 24, 2020, now U.S. Pat. No. 11,289,500, which claims priority under Korean Patent Application No. 10-2019-0095526 filed on Aug. 6, 2019 in the Korean Intellectual Property Office, U.S. patent application Ser. No. 17/001,035 being further a continuation-in-part application of application Ser. No. 16/814,491, filed on Mar. 10, 2020, now U.S. Pat. No. 11,211,391, which claims priority under Korean Patent Application No. 10-2019-0095526 filed on Aug. 6, 2019 in the Korean Intellectual Property Office, the disclosure of each being incorporated herein by reference in its entirety.

BACKGROUND

The present disclosure relate to memory devices.

A memory device may provide functions of writing and erasing data, or reading written data. Memory devices may be classified into nonvolatile memory devices and volatile memory devices. Nonvolatile memory devices retain their stored data even when their power supplies are interrupted. Data storage capacity required for memory devices tends to be increased. Accordingly, various methods have been proposed to increase integration density of a memory device.

SUMMARY

Example embodiments provide a memory device having integration density increased by forming a cell region, included in the memory device, to be asymmetric in at least one direction among directions parallel to an upper surface of a substrate.

According to some example embodiments, a memory device comprises a peripheral circuit region including a first substrate and circuit elements on the first substrate, the circuit elements including a row decoder, and a memory cell region including a cell array region and a cell contact region, wherein the cell array region includes wordlines, stacked on a second substrate on the peripheral circuit region, and channel structures extending in a direction perpendicular to an upper surface of the second substrate and penetrating the wordlines, wherein the cell contact region includes cell contacts connected to the wordlines and on both sides of the cell array region in a first direction parallel to the upper surface of the second substrate, the cell contacts including a first cell contact region and a second cell contact region, the first and second cell contact regions having different lengths to each other in the first direction, wherein each of the first and second cell contact regions includes first pads having different lengths than each other in the first direction, and second pads different from the first pads, wherein the cell contacts are connected to the wordlines in the first pads, wherein the number of the second pads included in the first cell contact region is greater than the number of the second pads included in the second cell contact region, and wherein the memory cell region includes a first metal pad and the peripheral circuit region includes a second metal pad, and the memory cell region and the peripheral circuit region are vertically connected to each other by the first metal pad and the second metal pad.

According to some example embodiments, a memory device comprises a memory cell region including a first metal pad and a plurality of cell regions, each of the plurality of cell regions including at least one memory block, and a peripheral circuit region including a second metal pad and pass elements, wherein each of the plurality of cell regions includes a cell array region, in which a plurality of wordlines are connected to the pass elements and a plurality of channel structures penetrating through the wordlines, and a cell connect region, in which the wordlines extending from the cell array region are connected to a plurality of cell contacts, and at least one of the pass elements is commonly connected to a pair of wordlines included in a pair of cell regions, adjacent to each other among the cell regions, and the pair of wordlines are on the same level.

According to some example embodiments, a memory device comprises a memory cell region including a first metal pad, and a peripheral circuit region including a second metal pad and pass elements, and vertically connected to the memory cell region by the first metal pad and the second metal pad, wherein the memory cell region includes a plurality of cell regions, each of the plurality of cell regions including a cell array region including wordlines stacked on a substrate above the peripheral circuit region and channel structures penetrating through the wordlines, wherein each of the plurality of the cell regions include a first cell region and a second cell region, adjacent to each other in a first direction parallel to an upper surface of the substrate, and a third cell region and a fourth cell region adjacent to each other in the first direction, and a distance between the cell array region of the first cell region and the cell array region of the second cell region is different from a distance between the cell array region of the third cell region and the cell array region of the fourth cell region.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
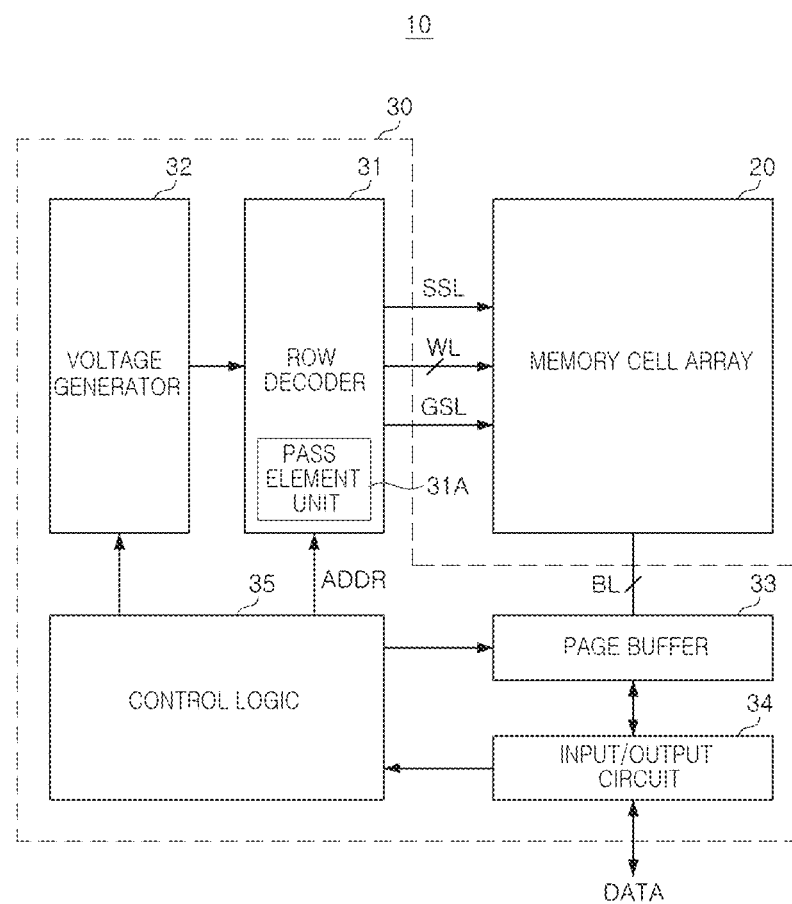
FIGS. 1 and 2 are schematic diagrams of a memory device according to some example embodiments.
Figure 2:
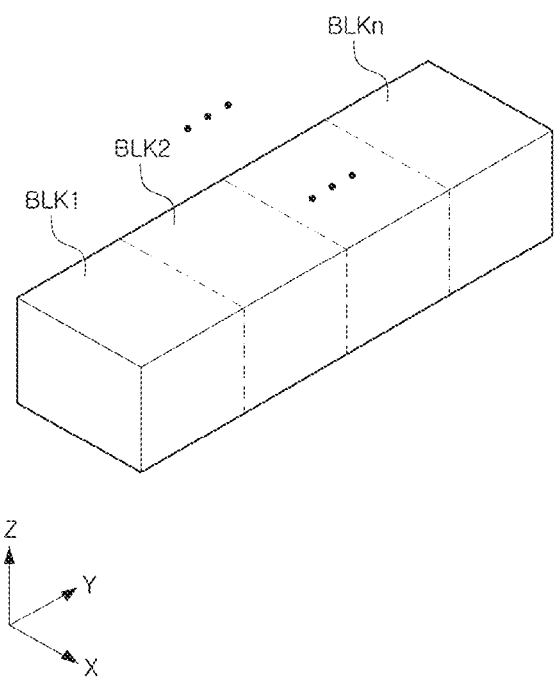

FIGS. 1 and 2 are schematic block diagrams of a memory device according to some example embodiments.

Referring to FIG. 1, a memory device 10 may include a memory cell array 20 and a peripheral circuit 30. The peripheral circuit 30 may include a row decoder 31, a voltage generator 32, a page buffer 33, an input/output circuit 34, a control logic 35, and the like. The memory cell array 20 may include a plurality of memory cells, and may be divided into a plurality of memory blocks. The plurality of memory cells may be connected to the row decoder 31 through a string select line SSL, wordlines WL, and a ground select line GSL, and connected to the page buffer 33 through bitlines BL. In example embodiments, a plurality of memory cells, arranged in the same row, may be connected to the same wordline WL, and a plurality of memory cells, arranged in the same column, may be connected to the same bitline BL.

The row decoder 31 may decode address decoder ADDR, received from the control logic 35 or the like, to generate and transfer voltage for driving wordlines WL. The row decoder 31 may input a wordline voltage, generated by the voltage generator 32, to the wordlines WL in response to control of the control logic 35. As an example, the row decoder 31 may be connected to the wordlines WL through pass elements of a pass element unit 31A, and may input the wordline voltage to the wordlines WL when the pass elements of the pass element unit 31A are turned on.

The page buffer 33 is connected to the memory cell array 20 through bitlines BL, and may read data, stored in memory cells, or write data into the memory cells. The page buffer 33 may include a column decoder and a sense amplifier. The column decoder may select at least a portion of bitlines BL of the memory cell array 20, and the sense amplifier may read data of a memory cell connected to a bitline selected by the column decoder during a reading operation.

The input/output circuit 34 may receive data DATA and transfer the received data DATA to the page buffer 33 during a programming operation, and may output data DATA, read from the memory cell array 20 by the page buffer 33, to an external entity during a reading operation. The input/output circuit 34 may transfer an address or an instruction, received from an external memory controller, to the control logic 35.

The control logic 35 may control operations of the row decoder 31, the voltage generator 32, the page buffer 33, and the like. In some example embodiments, the control logic 35 may operate according to a control signal and an external voltage transmitted from an external memory controller or the like.

The voltage generator 32 may generate control voltages used for the operation of the memory device 10, for example, a programming voltage, a reading voltage, an erasing voltage, a passing voltage, and the like, using an externally input power supply voltage. A voltage, generated by the voltage generator 32, may be supplied to the peripheral circuit 30 or may be input to the memory cell array 20 through the row decoder 31 or the like.

As an example, a programming voltage may be input to a selected wordline connected to a selected memory cell to which data is to be written during a programming operation. A passing voltage, lower than the programming voltage, may be input to wordlines connected unselected memory cells, included in a single memory cell string, sharing a channel region with the selected memory cell.

In some example embodiments, during a reading operation, a reading voltage may be input to a selected wordline, connected to a selected memory cell from which data is to be read, and a passing voltage may be input to unselected wordlines connected to unselected memory cells sharing a channel region sharing a channel region with the selected memory cell. In some example embodiments in which each of the memory cells stores data having a plurality of bits, the row decoder 31 may input a plurality of reading voltages, having magnitudes different from each other, into a selected wordline.

Referring to FIG. 2, the memory cell array 20 may include a plurality of memory blocks BLK1 to BLKn. Each of the memory blocks BLK1 to BLKn may include wordlines, stacked in a third direction (a Z-axis direction), and channel structures, extending in the third direction (the Z-axis direction), on a plane defined by a first direction (an X-axis direction) and a second direction (a Y-axis direction). The wordlines and the channel structures may provide three-dimensionally arranged memory cells. Each of the memory blocks BLK1 to BLKn may include bitlines extending in the first direction (the X-axis direction) or the second direction (the Y-axis direction) and connected to the channel structures. As an example, in the memory cell array 20, the memory blocks BLK1 to BLKn may be arranged in the first direction (the X-axis direction) and the second direction (the Y-axis direction).

Figure 3:
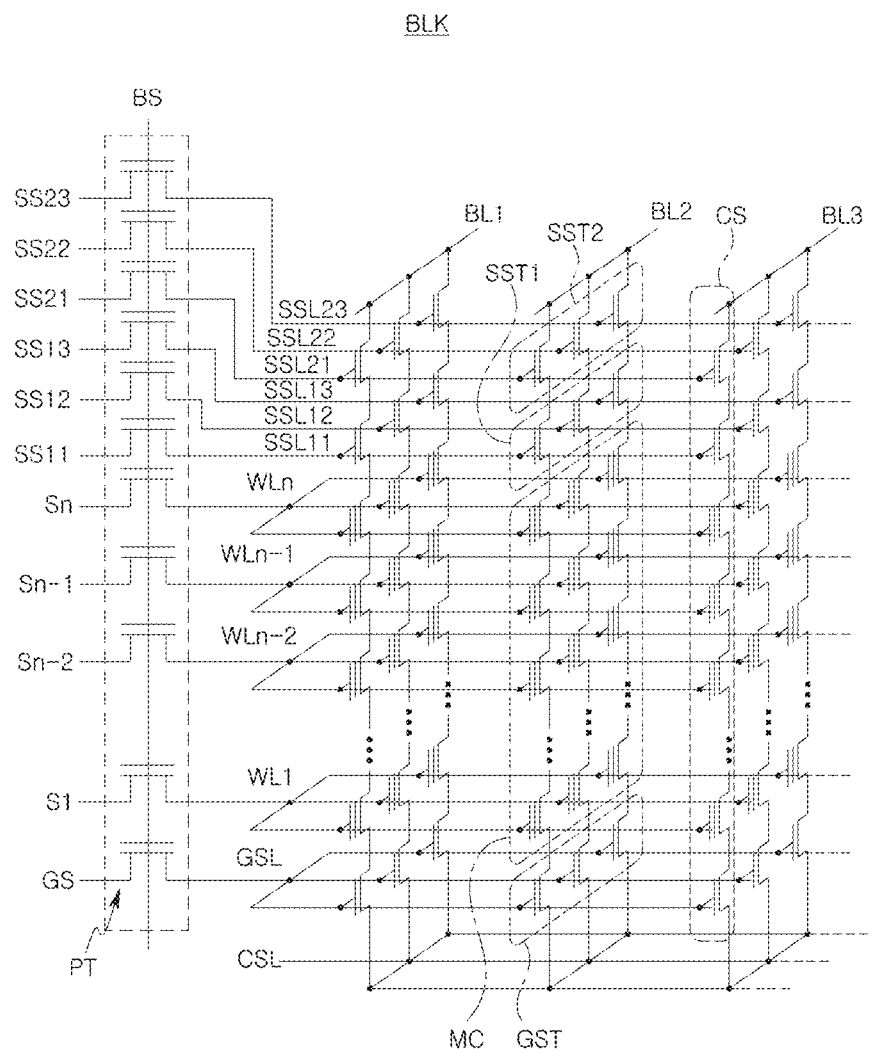
FIGS. 3 and 4 illustrate a connection relationship between a memory cell array and pass elements in a memory device according to some example embodiments.
Figure 4:
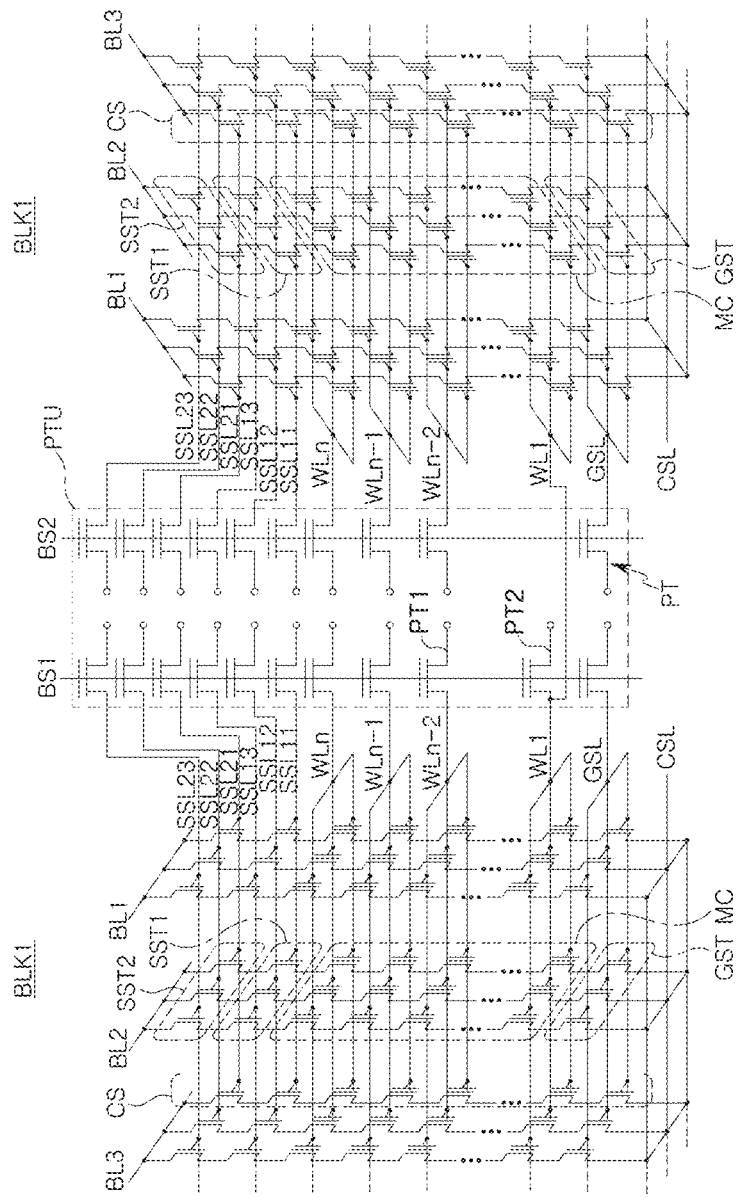

FIGS. 3 and 4 illustrate a connection relationship between a memory cell array and pass elements in a memory device according to some example embodiments.

Referring to FIG. 3, a single memory block BLK may include a plurality of memory cell strings S, and at least a portion of the memory cell strings S may share wordlines WL1 to WLn and bitlines BL1 to BL3.

Each of the memory cell strings S may include a plurality of memory cells MC connected between first and second string select transistors SST1 and SST2 and a ground select transistor GST. The first and second string select transistors SST1 and SST2 may be connected to each other in series. The overlying second string select transistor SST2 may be connected to one of the bitlines BL1 to BL2. The ground select transistor GST may be connected to a common source line CSL.

The plurality of memory cells MC may be connected to each other in series between the first and second string select transistors SST1 and SST2 and the ground select transistor GST. In example embodiments, the number of the string select transistors SST1 and SST2 and the ground select transistor GST may be variously changed. The memory cell strings S may further include at least one dummy memory cell.

Gate electrodes of the plurality of memory cells MC may be connected to the wordlines WL1 to WLn. A gate electrode of the ground select transistor GST may be connected to the ground select line GSL, and gate electrodes of the first and second string select transistors SST1 and SST2 may be connected to the string select lines SSL11 to SSL23.

The wordlines WL1 to WLn, the ground select line GSL, and the string select lines SSL11 to SSL23 may be connected to a pass element unit PTU including pass elements PT. The pass elements PT may be turned on and off by a block select signal BS. A programming operation, a reading operation, an erasing operation, and the like, may be performed on a plurality of memory cells MC by voltages GS, S1 to Sn, and SS11 input to the wordlines WL1 to WLn, the ground select line GSL, and the string select lines SSL11 to SSL23 while the pass elements PT are turned on. In some of the example embodiments illustrated in FIG. 3, pass elements PT, connected to wordlines WL1 to WLn included in the block BLK, may not be shared by wordlines included in another block.

Referring to FIG. 4, a first memory block BLK1 and a second memory block BLK2 may share at least one of the pass elements. In some example embodiments illustrated in FIG. 4, the pass element unit PTU may include first pass elements PT1 and at least one second pass element PT2, and the second pass element PT2 may be shared by at least one of the wordlines WL1 to WLn of the first memory block BLK1 and the second memory block BLK2. Referring to FIG. 4, the second pass element PT2 may be commonly connected to a first wordline WL1 of the first memory block BLK1 and a first wordline WL1 of the second memory block BLK2.

The pass elements, connected to the wordlines WL1 to WLn of the first memory block BLK1, may be turned on and off by a first block select signal BS1 and pass elements, connected to the wordlines WL1 to WLn of the second memory block BLK2, may be turned on and off by a second block select signal BS2. In example embodiments, the first block select signal BS1 and the second block select signal BS2 may be the same as each other or different from each other. When the first block selection signal BS1 and the second block selection signal BS2 are the same as each other, the pass elements included in the pass element unit PTU may be turned on or off at the same time. Thus, the first memory block BLK1 and the second memory block BLK2 may be driven at the same time.

Figure 5:
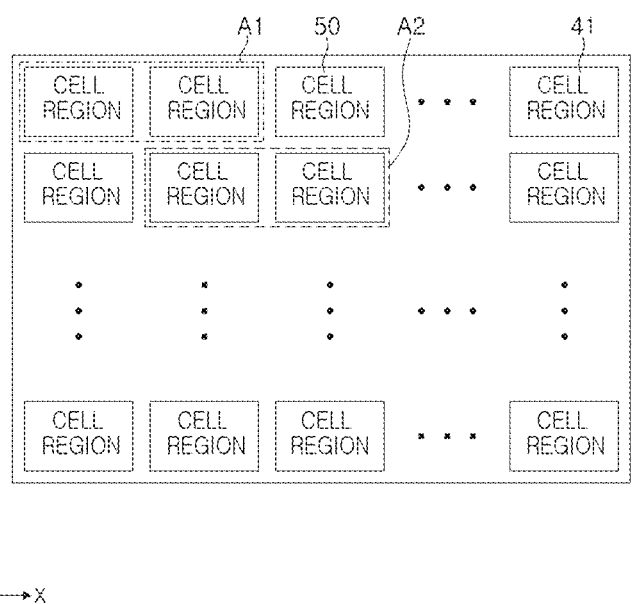
FIG. 5 is a schematic plan view of a memory device according to some example embodiments.

FIG. 5 is a schematic plan view of a memory device according to some example embodiments.

Referring to FIG. 5, a memory device 40 according to some example embodiments may include a plurality of cell regions 50. The plurality of cell regions 50 may be arranged on a substrate 41. Each of the cell regions 50 may include wordlines stacked in a direction perpendicular to an upper surface of the substrate 41, channel structures extending in a direction perpendicular to the upper surface of the substrate 41, and cell contacts connected to the wordlines, and the like.

Each of the cell regions 50 may include a cell array region, in which channel structures are disposed, and a cell contact region, extending from the cell array region, in which wordlines and cell contacts are connected to each other. For example, the cell contact region may be disposed around the cell array region in a direction parallel to the upper surface of the substrate 41. Accordingly, cell contact regions may be disposed adjacent to each other on a boundary between the cell regions 50.

In the memory device 40 according to the example embodiments illustrated in FIG. 5, a peripheral circuit region may be disposed below the substrate 41 on which the cell regions 50 are disposed. The peripheral circuit area may include at least a portion of circuits for driving memory cells included in the cell regions 50, for example, a row decoder, a voltage generator, a page buffer, an input/output circuit, and control logic.

The row decoder may include pass elements connected to wordlines of the cell regions 50. In some example embodiments, among wordlines included in cell regions 50 different from each other, at least one wordline may share pass elements. The cell contact region, disposed around the cell array region, may have an asymmetrical structure such that among wordlines included in cell regions 50 adjacent to each other, at least one wordline may share pass elements. Hereinafter, this will be described in further detail with reference to FIGS. 6A and 6B.

Figure 6A:
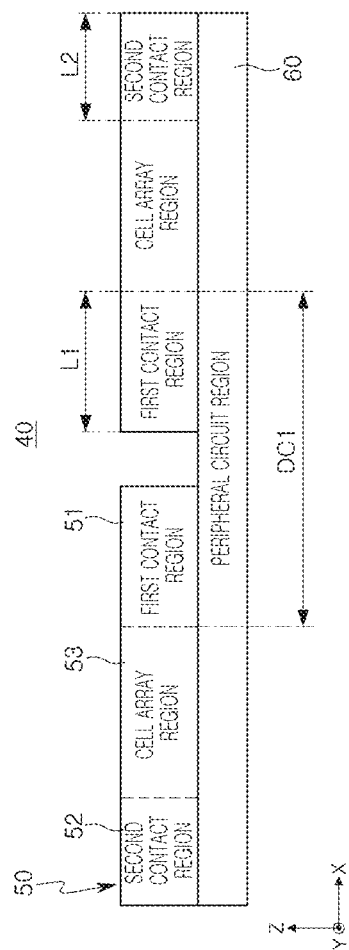
FIGS. 6A and 6B illustrates regions of the memory devices illustrated in FIG. 5.
Figure 6B:
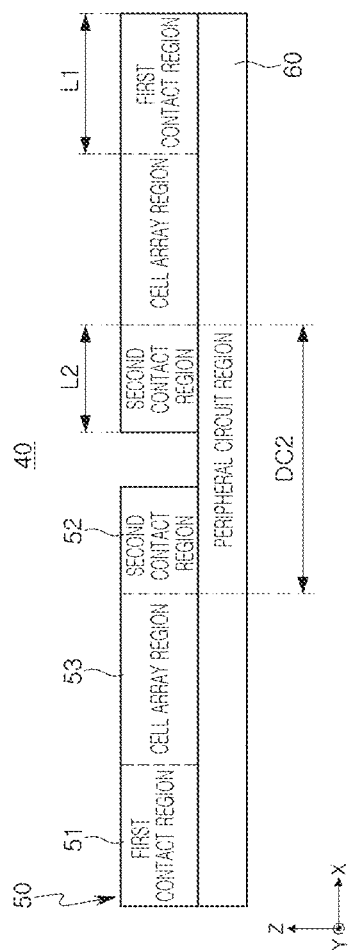

FIGS. 6A and 6B illustrate regions of the memory devices illustrated in FIG. 5. As an example, FIG. 6A may be an enlarged view of a region A1 in FIG. 5, and FIG. 6B may be an enlarged view of a region A2 in FIG. 5. Referring to FIGS. 6A and 6B, the memory device 40 may include cell regions 50 and peripheral circuit regions 60 stacked vertically. As an example, the cell regions 50 may be disposed above the peripheral circuit region 60.

Each of the cell regions 50 may include a first cell contact region 51, a second cell contact region 52, and a cell array region 53 disposed therebetween. The cell array region 53 may include wordlines, stacked on each other, channel structures penetrating through the wordlines, and the like. Each of the first and second cell contact regions 51 and 52 may be a region in which wordlines, extending from the cell array region 53, and cell contacts are connected to each other, and may be disposed on both sides of the cell array region 53 in a first direction (an X-axis direction).

In some example embodiments, the first cell contact region 51 and the second cell contact region 52 may have lengths, different from each other in the first direction (the X-axis direction). For example, a length L1 of the first cell contact region 51 may be greater than a length L2 of the second cell contact region 52 in the first direction (the X-axis direction).

Referring to FIG. 6A illustrating an enlarged view of region A1 in FIG. 5, first cell contact regions 51 may be adjacent to each other between the cell regions 50. Referring to FIG. 6B illustrating an enlarged view of region A2 in FIG. 5, second cell contact regions 52 may be adjacent to each other between the cell regions 50. Therefore, a distance between cell array regions 53, included in the cell regions 50 adjacent to each other in the memory device 40, may be different from each other depending on a position thereof. In the example embodiments illustrated in FIG. 6A, a first distance DC1 between the cell array regions 53 may be greater than a second distance DC2 between the cell array regions 53 in the example embodiments illustrated in FIG. 6B.

In some example embodiments, pass elements connected to wordlines may be disposed in the peripheral circuit region 60 below each of the first and second cell contact regions 51 and 52. The wordlines and the pass elements may be connected to each other through cell contacts disposed in the first cell contact region 51 and the second cell contact region 52. In some example embodiments, at least a portion of the cell contacts, connected to the wordlines in the second cell contact region 52, may be commonly connected to one of the pass elements. Accordingly, the number of pass elements, included in the peripheral circuit region 60, may be reduced, and an area of the second cell contact region 52 may be reduced to increase integration density of the memory device 40.

Figure 7A:
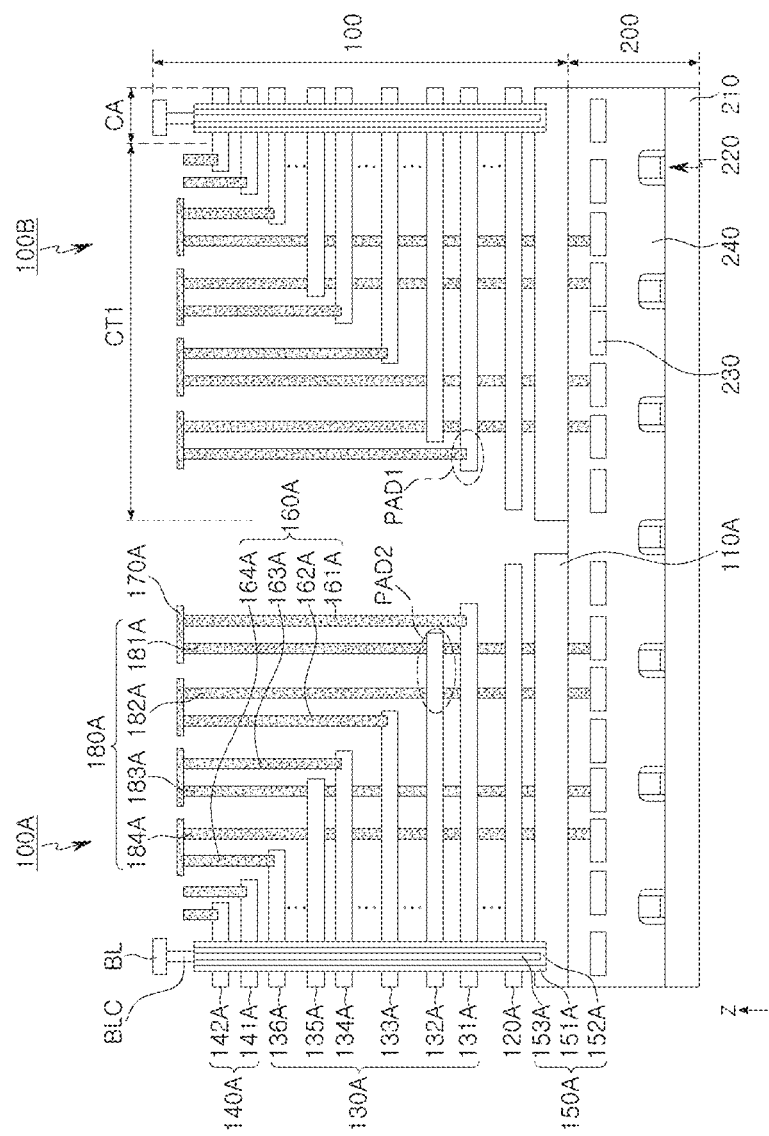
FIGS. 7A and 7B illustrate a portion of a memory device according to some example embodiments.
Figure 7B:
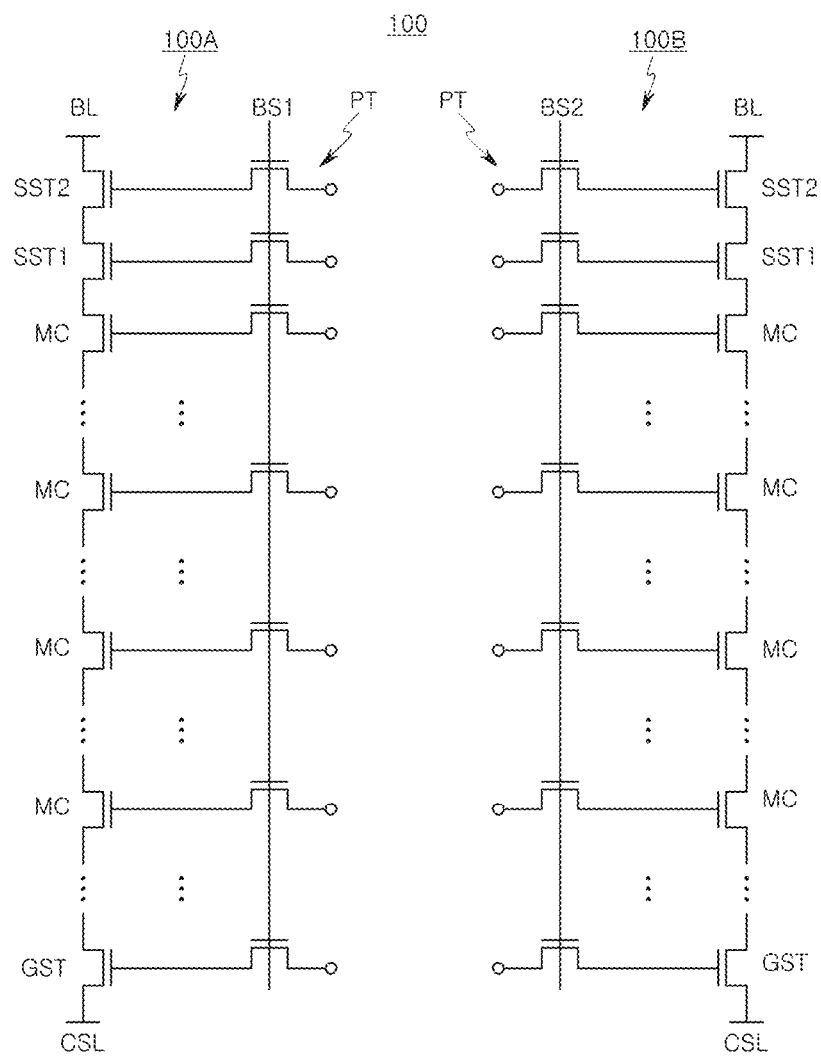

FIGS. 7A and 7B illustrate a portion of a memory device according to some example embodiments.

FIG. 7A may be a cross-sectional view illustrating a region of a memory device according to some example embodiments, and FIG. 7B may be an equivalent circuit diagram corresponding to FIG. 7A. As an example, in the example embodiments described with reference to FIGS. 7A and 7B, first contact regions may correspond to regions adjacent to each other, as described above in FIG. 6A.

Referring first to FIG. 7A, a memory device may include a peripheral circuit region 200 and a cell region 100 disposed above the peripheral circuit region 200. The peripheral circuit region 200 may include a first substrate 210, a plurality of circuit elements 220 formed on the first substrate 210, lower interconnection lines 230 connected to the circuit elements 220, and a lower interlayer dielectric. The interlayer dielectric 240 may be disposed to cover the circuit elements 220 and the lower interconnection lines 230, and may include an insulating material such as a silicon oxide, a silicon nitride, and/or the like.

The cell region 100 may include a first cell region 100A and a second cell region 100B, and the first cell region 100A and the second cell region 100B have the same structure. Hereinafter, the structure of the cell region 100 will be described with reference to the first cell region 100A. As an example, each of the first cell region 100A and the second cell region 100B may provide at least one memory block.

The first cell region 100A may include a second substrate 110A disposed on the lower interlayer dielectric 240. A plurality of wordlines 131A to 136A (130A) may be stacked on the second substrate 110A in a third direction (a Z-axis direction) perpendicular to an upper surface of the second substrate 110A. String select lines 141A to 142A (140A) and a ground select line 120A may be disposed above and below the wordlines 130A, respectively. The channel structure 150A may extend in a third direction to penetrate through the wordlines 130A, the string select lines 140A, and the ground select line 120A. The channel structure 150A may include a data storage layer 151A, a channel layer 152A, a buried insulating layer 153A, and the like, and the channel layer 152A may be electrically connected to a bitline BL through a bitline contact BLC. In some example embodiments, the bitline BL may extend in a second direction (a Y-axis direction). A region, in which the channel structure 150A and the bitline BL are disposed, may be defined as a cell array region CA.

The wordlines 130A may extend in the first direction (the X-axis direction) and may be connected to a plurality of cell contacts 161A to 164A (160A) in a first cell contact region CT1, adjacent to the cell array region CA, in the first direction. In some example embodiments, the wordlines 130A may extend with lengths different from each other in the first and second directions to provide pads PAD1 and PAD2. The cell contacts 160A and the wordlines 130A may be connected to each other on the pads PAD1 and PAD2.

Referring to FIG. 7A, the first cell contact area CT1 may include first pads PAD1 and second pads PAD2 having an area different from an area of the first pads PAD1. Each of the second pads PAD2 may have an area larger than an area of each of the first pads PAD1. In some example embodiments, a length of each of the second pads PAD2 in the first direction may be greater than a length of each of the first pads PAD1 in the first direction.

Vertical vias 181A to 184A (180A) may be disposed in at least a portion of the pads PAD1 and PAD2 to be connected to lower interconnection lines 104 of a peripheral circuit region P through a portion of the wordlines 130A and the second substrate 110A. The pads PAD1 and PAD2, in which the vertical vias 180A are disposed, may be disposed in locations different from locations of the pads PAD1 and PAD2, to which the cell contacts 160A and the wordlines 130A are connected, in the second direction.

The vertical vias 180A may be connected to the cell contacts 160A through upper interconnection lines 170A. The second pads PAD2, and the wordlines 130A and the vertical vias 180A, disposed below the second pads PAD2, may be electrically isolated from each other. As an example, the vertical vias 180A may extend to lower interconnection lines 230 through a region in which sacrificial layers for forming the wordlines 130 are not remove and remain.

FIG. 7B may be an equivalent circuit diagram of the memory device illustrated in FIG. 7A. Referring to FIG. 7B, each of the first cell region 110A and the second cell region 110B may include memory cells MC, a ground select transistor GST, a first string select transistor SST1, a second string select transistor SST, and the like. The ground select transistor GST may be connected to a common source line CSL, and the second string select transistor SST2 may be connected to a bitline BL.

In the example embodiments illustrated in FIGS. 7A and 7B, the first cell region 110A and the second cell region 110B may not share pass elements PT. Referring to FIG. 7B, pass elements, connected to the memory cells MC, the ground select transistor GST, the first string select transistor SST1, and the second string select transistor SST2 in the first region 110A, may be isolated from the second cell region 110B.

The pass elements PT, connected to the first cell region 110A, may be controlled by a first block select signal BS1, and the pass elements PT, connected to the second cell region 110B, may be controlled by a second block select signal BS2. According to setting of the first block select signal BS1 and the second block select signal BS2, the first cell region 110A and the second cell region 110B may be driven simultaneously or independently.

Figure 8A:
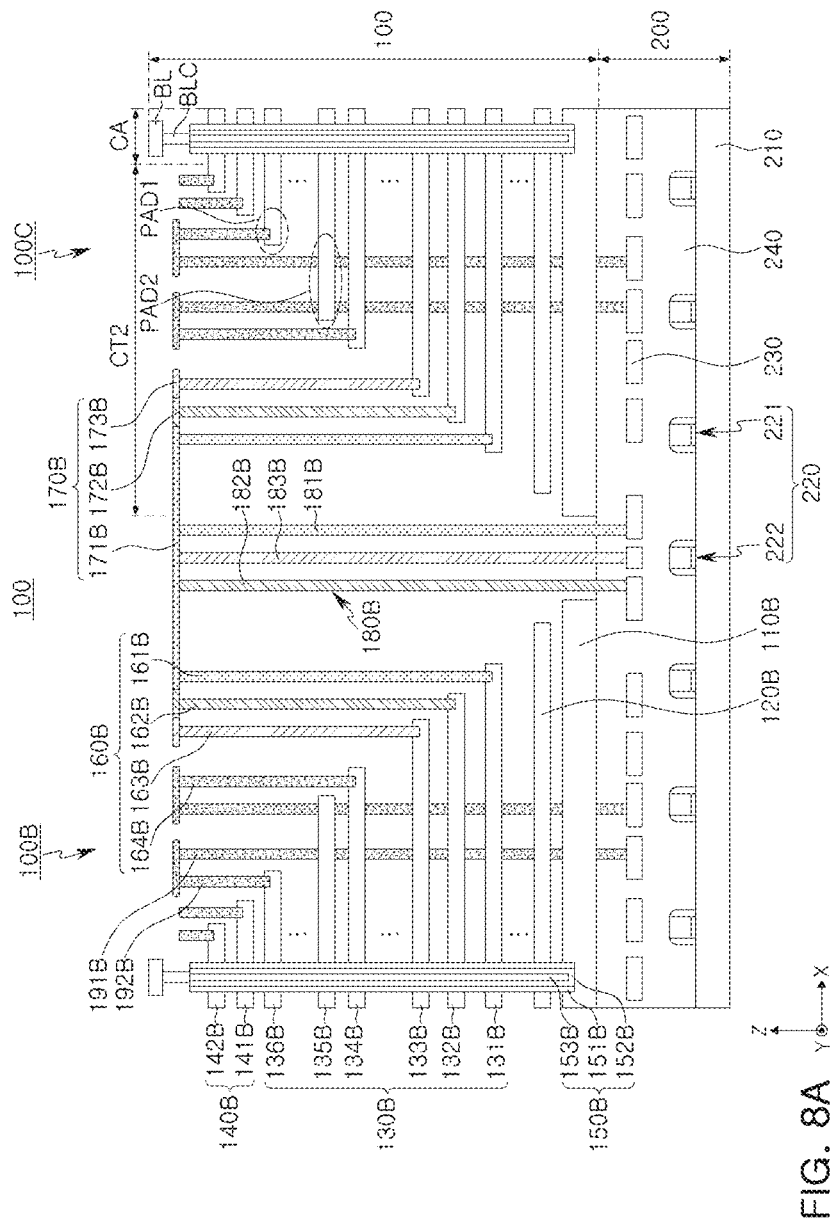
FIGS. 8A and 8B illustrate a region of a memory device according to some example embodiments.
Figure 8B:
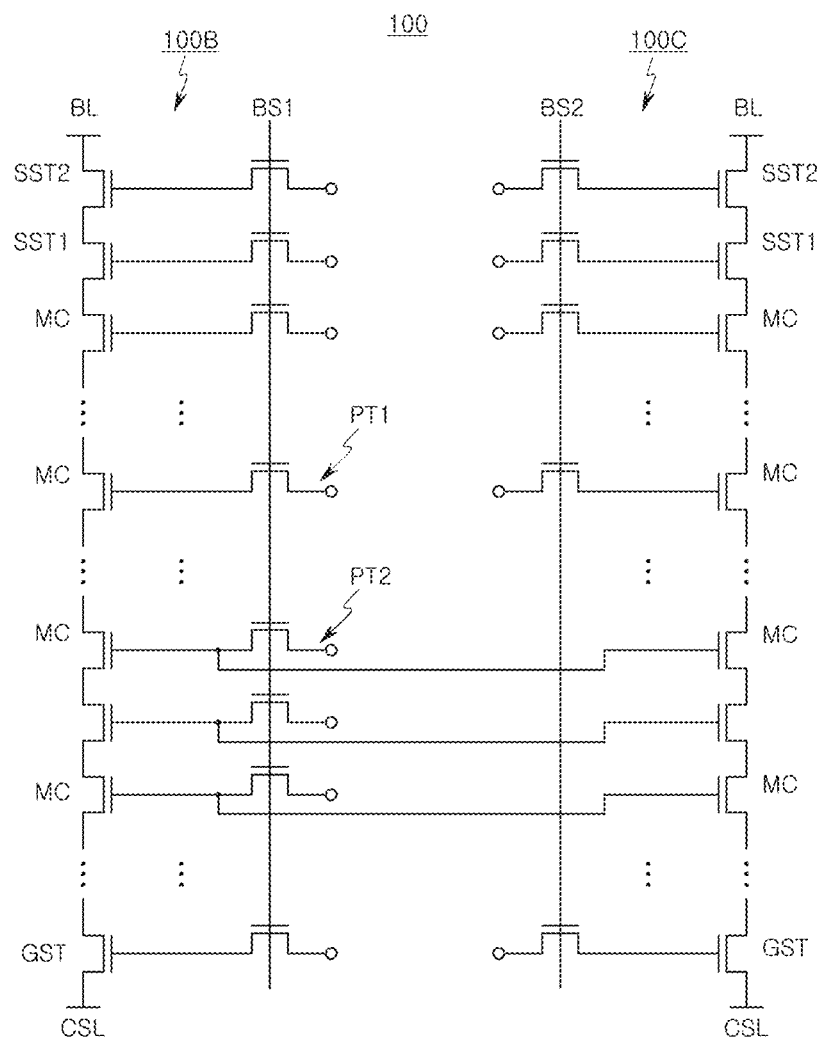

FIGS. 8A and 8B illustrate a region of a memory device according to some example embodiments.

FIG. 8A may be a cross-sectional view illustrating a region of a memory device according to some example embodiments, and FIG. 8B may be an equivalent circuit diagram corresponding to FIG. 8A. The memory device according to the example embodiments described with reference to FIGS. 8A and 8B may be the same as the memory device according to the example embodiments described with reference to FIGS. 7A and 7B. However, the region illustrated in FIG. 8A may be different from the region illustrated in FIG. 7A. As an example, in the memory device according to some example embodiments described with reference to FIGS. 8A and 8B, second contact regions may correspond to regions adjacent to each other, as described above with reference to FIG. 6B.

Referring to FIG. 8A, a memory device may include a peripheral circuit region 200 and a cell region 100 disposed above the peripheral circuit region 200. The peripheral circuit region 200 may include a first substrate 210, a plurality of circuit elements 220 formed on the first substrate 210, lower interconnection lines 230 connected to the circuit elements 220, a lower interlayer dielectric 240, and the like.

The peripheral circuit region 200 may extend continuously from a region of the memory device illustrated in FIG. 7A.

The cell region 100 may include a second cell region 100B and a third cell region 100C, and the second cell region 100B and the third cell region 100C may have the same structure as the first cell region 100A described with reference to FIG. 7A. A cell array region CA and a second cell contact region CT2, included in the cell region 100, will be described in detail with reference to the second cell region 100B illustrated in FIG. 8A.

The second cell region 100B may include a second substrate 110B disposed on the lower interlayer dielectric 240, and a plurality of wordlines 131B to 136B (130B) may be stacked on the second substrate 110B in a third direction (a Z-axis direction) perpendicular to an upper surface of the second substrate 110B. String select lines 141B to 142B (140B) and a ground select line 120B may be disposed on above and below the wordlines 130B, respectively. A channel structure 150B may extend in the third direction and may penetrate through the wordlines 130B, the string select lines 140B, and the ground select line 120B. The channel structure 150B may include a data storage layer 151B, a channel layer 152B, a buried insulating layer 153B, and the like, and the channel layer 152B may be electrically connected to a bitline BL through a bitline contact BLC. In some example embodiments, the bitline BL may extend in a second direction (a Y-axis direction). A region, in which the channel structure 150B, the bitline BL, and the like are disposed, may be defined as a cell array region CA.

The wordlines 130B may extend in the first direction (the X-axis direction) and may be connected to a plurality of cell contacts 161B to 164B (160B) in a second cell contact region CT2 adjacent to the cell array region CA in the first direction. In some example embodiments, the wordlines 130B may extend with lengths different from each other in the first and second directions to provide pads PAD1 and PAD2. The cell contacts 160B and the wordlines 130B may be connected to each other on a portion of the pads PAD1 and PAD2.

Similarly to the first cell contact region CT1 described with reference to FIG. 7A, the second cell contact region CT2 may include at least one second pad PAD2 different from the first pads PAD1. The second pad PAD2 may have an area larger than an area of each of the first pads PAD1. In some example embodiments, a length of the second pad PAD2 in the first direction may be greater than a length of each of the first pads PAD1 in the first direction.

Referring to both FIGS. 7A and 8A, the number of second pads PAD2, included in the first cell contact region CT1 in the second cell region 100B, may be greater than the number of second pads PAD2 included in the second contact region CT2 in the second cell region 110B. Accordingly, the second cell contact region CT2 may extend to be relatively shorter than the first cell contact region CT1 in the first direction, and the integration density of the cell regions 100A, 100B, and 100C may be increased.

As an example, the cell regions 100B and 100C, adjacent to each other with the second cell contact region CT2 interposed therebetween, may share at least one of the pass elements. Referring to FIG. 8A, circuit elements 220 may include first pass elements 221 and second pass elements 222. Among wordlines 130B included in the second cell region 100B, at least a portion of the wordlines 130B may share the second pass elements 222 with wordlines included in the third cell regions 100C. The wordlines, sharing the second pass elements 222, may be disposed at the same height in a third direction.

Referring to FIG. 8A, the second cell contact region CT2 may include common vertical vias 181B to 183B (180B) connecting the lower interconnection lines, connected to the second pass elements 222, to some cell contacts 161B to 163B among the cell contacts 160B. The common vertical vias 180B may be commonly connected to at least a portion of the wordlines of the second cell region 100B and the third cell region 100C through common upper interconnection lines 171B to 173B (170B). The common upper interconnection lines 171B to 173B may be disposed in locations different from each other in the second direction to be electrically isolated from each other. The common vertical vias 180B may extend to the peripheral circuit region 200 without penetrating through the second substrate 110B.

Among the cell contacts 160B, a certain cell contact 164B may be connected to the first pass elements 221 of the peripheral circuit region 200 through an individual vertical via 291B. The individual vertical via 291B may be connected to the cell contact 164B through an individual upper interconnection line 292B. As an example, the individual vertical via 291B may extend from at least one of the pads PAD1 and PAD2 to the peripheral circuit region 200.

As illustrated in FIG. 8A, in the second cell contact region CT2, a portion of the wordlines included in adjacent cell regions 100B and 100C may be connected to the common vertical vias 180B to share two pass elements 222. Accordingly, the number of second pads PAD2, used to extend the individual vertical vias 291B to the peripheral circuit region 200, may be reduced, and an area of the second cell contact region CT2 may be reduced to increase integration density of the memory device 100.

FIG. 8B may be an equivalent circuit diagram of the memory device illustrated in FIG. 8A. Referring to FIG. 8B, each of the second cell region 110B and the third cell region 110C may include memory cells MC, a ground select transistor GST, a first string select transistor SST1, a second string select transistor SST2, and the like. The ground select transistor GST may be connected to a common source line CSL, and the second string select transistor SST2 may be connected to a bitline BL.

Pass elements PT1 and PT2, connected to memory cells MC, may be divided into first pass elements PT1 and second pass elements PT2 depending on whether they are commonly connected to a second cell region 110B and a third cell region 110C. For example, the first pass elements PT1 may be connected to memory cells MC of any one of the second and third cell regions 110B and 110C, and the second pass elements PT2 may be commonly connected to a portion of memory cells MC included in the second and third cell regions 110B and 110C.

When a control operation is performed on the third cell region 100C, the second pass elements PT2 may be turned on using a first block select signal BS1. However, the second cell region 100B and the third cell region 100C may be driven independently of each other by controlling a voltage input to the second cell region 100B through the first pass elements PT1 connected to the second cell region 100B. In example embodiments, the second cell region 100B and the third cell region 100C may be driven at the same time.

Figure 9:
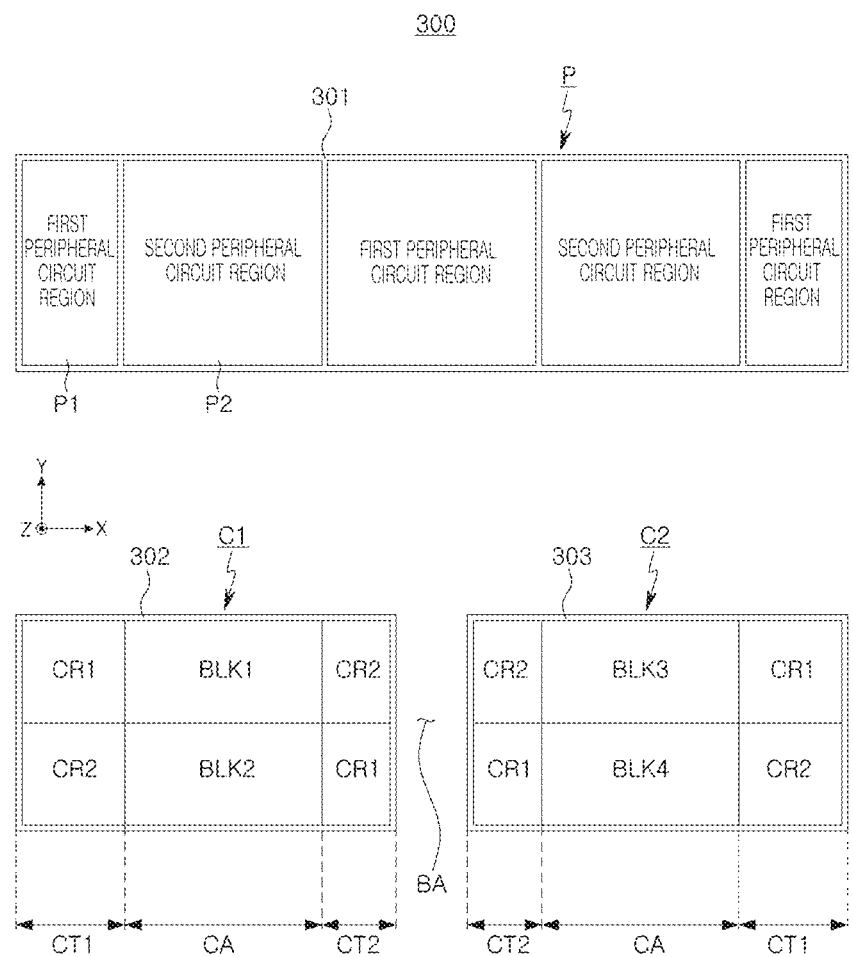
FIGS. 9 and 10 illustrate a schematic configuration of a memory device according to some example embodiments.
Figure 10:
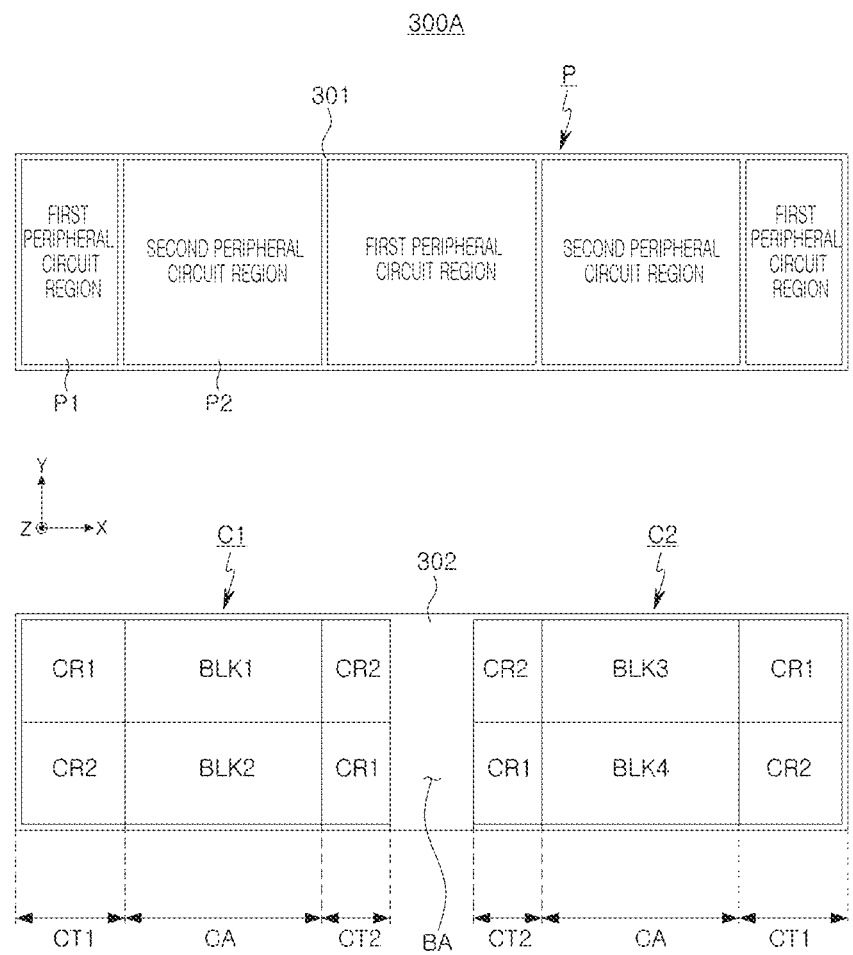

FIGS. 9 and 10 illustrate a schematic configuration of a memory device according to some example embodiments.

Referring first to FIG. 9, a memory device 300 may include a peripheral circuit region P and cell regions C1 and C2. The memory device 300 may have a cell-on-peripheral (COP) structure in which the cell regions C1 and C2 are disposed above the peripheral circuit region P. For example, the cell regions C1 and C2 may be disposed above the peripheral circuit region P in a third direction (a Z-axis direction). The peripheral circuit region P may include a plurality of circuit elements formed on a first substrate 301, and may be divided into a first peripheral circuit region P1 and a second peripheral circuit region P2.

The cell regions C1 and C2 may include a first cell region C1 and a second cell region C2 disposed in a first direction (an X-axis direction). The first cell region C1 and the second cell region C2 may be formed in second substrates 302 and 303 different from each other, respectively. Each of the first cell region C1 and the second cell region C2 may include a cell array region CA, a first cell contact region CT1 disposed on both sides of the cell array region CA in the first direction, and a second cell contact region CT2. The first cell region C1 and the second cell region C2 may have the same structure, and may be disposed to be horizontally symmetrical, or substantially symmetrical with respect to a boundary between the first cell region C1 and the second cell region C2.

Referring to the first cell region C1, the cell array region CA may include a first memory block BLK1 and a second memory block BLK2 divided in a second direction (a Y-axis direction). As an example, the first memory block BLK1 and the second memory block BLK2 may be divided by a wordline cut region extending in the first direction.

Wordlines of the first memory block BLK1 may extend in the first direction to provide a first connection region CR1, included in a first cell contact region CT1, and a second connection region CR2 included in a second cell contact region CT2. In addition, wordlines of the second memory block BLK2 may extend in the first direction to provide a first connection region CR1, included in a second cell contact region CT2, and a second connection region CR2 included in a first cell contact region CT1.

The first connection region CR1 and the second connection region CR2 may include first pads and second pads provided by wordlines. In the first connection region CR1, the first pads and the second pads may form steps in the first direction and the second direction, that is they may have different depths in the first direction and the section direction. In the second connection region CR2, the first pads and the second pads may form a step in the first direction. In some example embodiments, each of the first pads may be shorter than each of the second pads in the first direction.

In an example, wordlines of the first memory block BLK1 may be connected to a plurality of cell contacts in the first connection region CR1 of the first cell contact region CT1. At least a portion of the cell contacts, connected to the wordlines of the first memory block BLK1 in the first connection region CR1 of the first cell contact region CT1, may be connected to pass elements of the first peripheral circuit region P1 in the second connection region CR2 of the first cell contact region CT1.

A plurality of vertical vias, connected to pass elements, may be provided in at least a portion of the first pads and the second pads in the second connection region CR2 of the first cell contact region CT1. In some example embodiments, the vertical vias may be connected to at least a portion of the cell contacts connected to the wordlines of the first memory block BLK1 in the first connection region CR1 of the first cell contact region CT1 by upper interconnection lines extending in the second direction.

The cell contacts, connected to the wordlines of the first memory block BLK1 in the first connection region CR1 of the second cell contact region CT2, may be connected to pass elements of a first peripheral circuit region P1 in the second connection region CR2 of the second cell contact region CT2 or a boundary region between the first cell region C1 and the second cell region C2. A plurality of vertical vias, connected to pass elements, may be provided in the second connection region CR2 of the second cell contact region CT2 and a boundary region BA.

Among the plurality of vertical vias, the vertical vias, disposed in the second connection region CR2 of the second cell contact region CT2, may be connected to at least a portion of the cell contacts connected to the wordlines of the second memory block BLK1 in the first connection region CR1 of the second cell contact region CT2 by upper interconnection lines disposed above the first cell region C1. Among the vertical vias, the vertical vias, disposed in the boundary region BA, may be connected to the cell contacts connected to the wordlines of the second memory block BLK2 in the first connection region CR1 of the second cell contact region CT2 by the upper interconnection lines disposed above the first cell region C1.

The vertical vias, disposed in the boundary region BA, may be commonly connected to a portion of the wordlines of the second memory block BLK2 and a portion of wordlines of the fourth memory block BLK4. A portion of the wordlines of the second memory block BLK2 and the second memory block BLK4 may share pass elements through the vertical vias disposed in the boundary region BA. Thus, the number of second pads PAD2 may be reduced in the second cell contact region CT2 adjacent to the boundary region BA, and a distance between the first cell region C1 and the second cell region C2 may be reduced to increase integration density of the memory device 300.

In the example embodiments illustrated in FIG. 9, a portion of the pass elements, disposed below the second cell contact regions CT2, may be shared by wordlines included in different memory blocks BLK1 to BLK4. Thus, the number of the pass elements, disposed below the first cell contact regions CT1, may be greater than the number of the pass elements disposed below the second cell contact regions CT2.

Referring to FIG. 10, a memory device 300A may include a peripheral circuit region P and cell regions C1 and C2. Configurations of the peripheral circuit region P and the cell regions C1 and C2 may be similar to those described with reference to FIG. 9. However, a first cell region C1 and a second cell region C2 may be formed together on one second substrate 302. Thus, vertical vias, formed in a boundary area BA, may be connected to pass elements of the first peripheral circuit area P1 through the second substrate 302. In the boundary region BA, a substrate insulating layer may be provided to electrically isolate the vertical vias and the second substrate 302 from each other.

Figure 11:
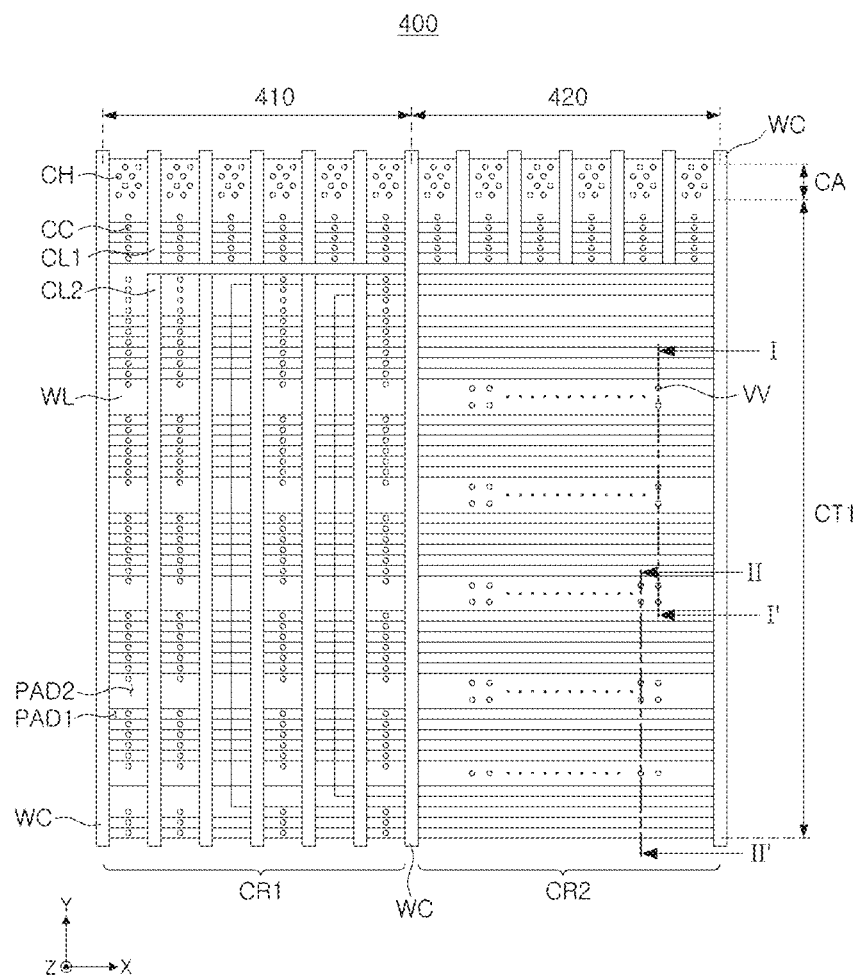
FIGS. 11 to 14 are schematic plan views of a memory device according to some example embodiments.
Figure 12:
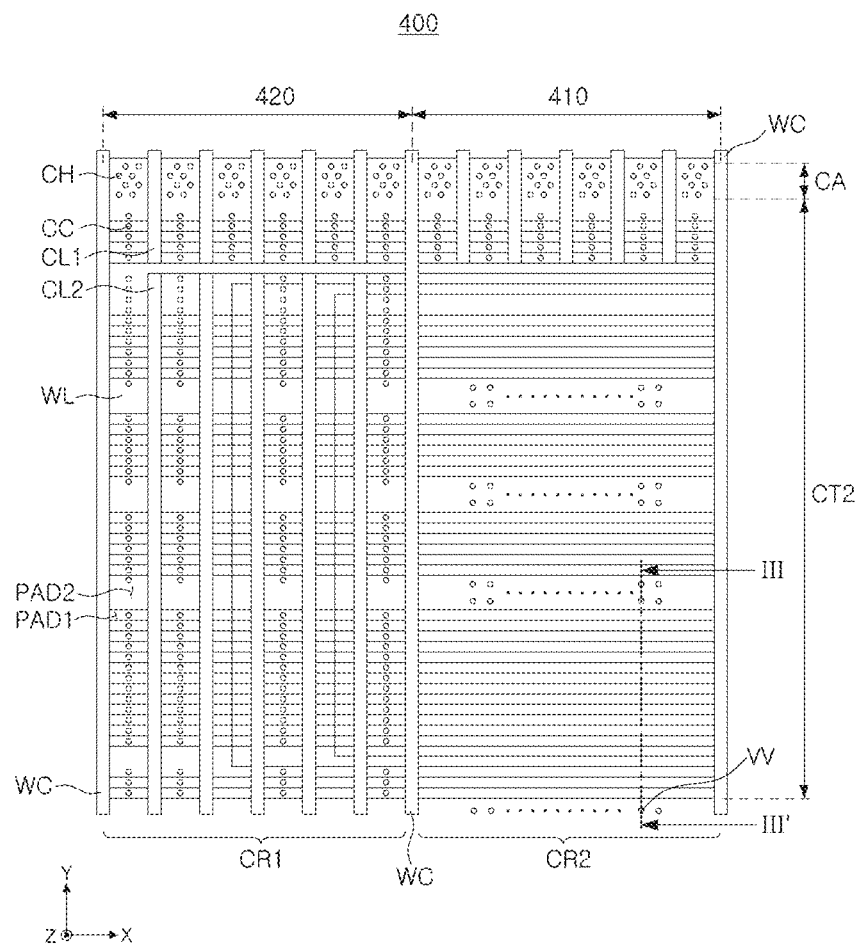
Figure 15:
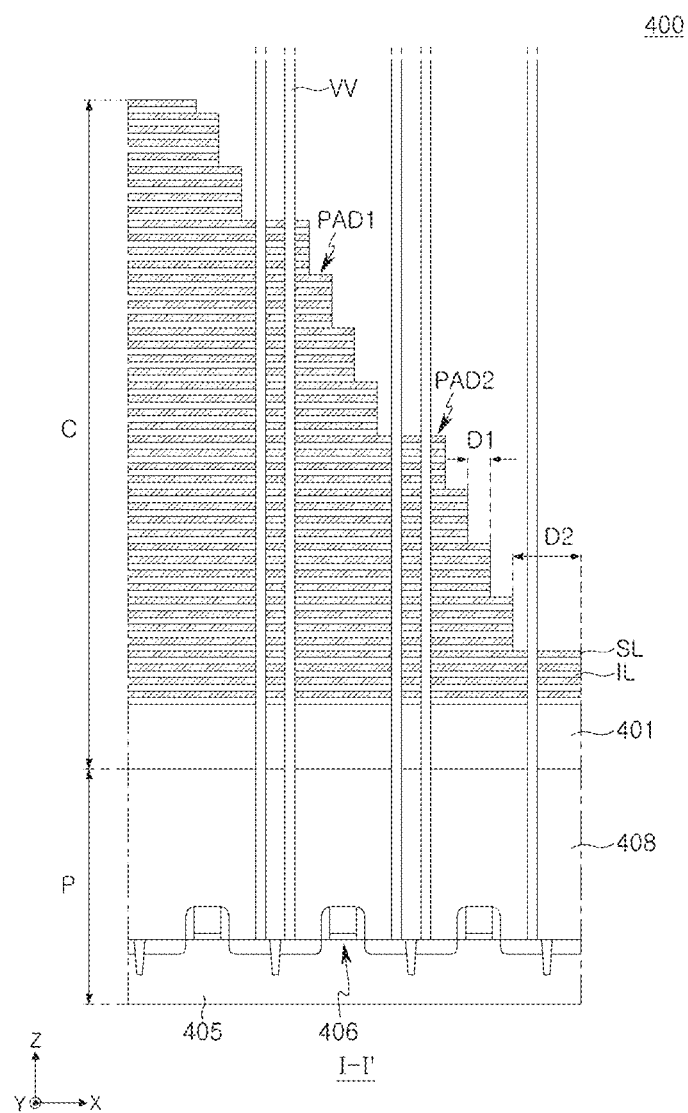
FIG. 15 is a cross-sectional view taken along line I-I' in FIG. 11.
Figure 16:
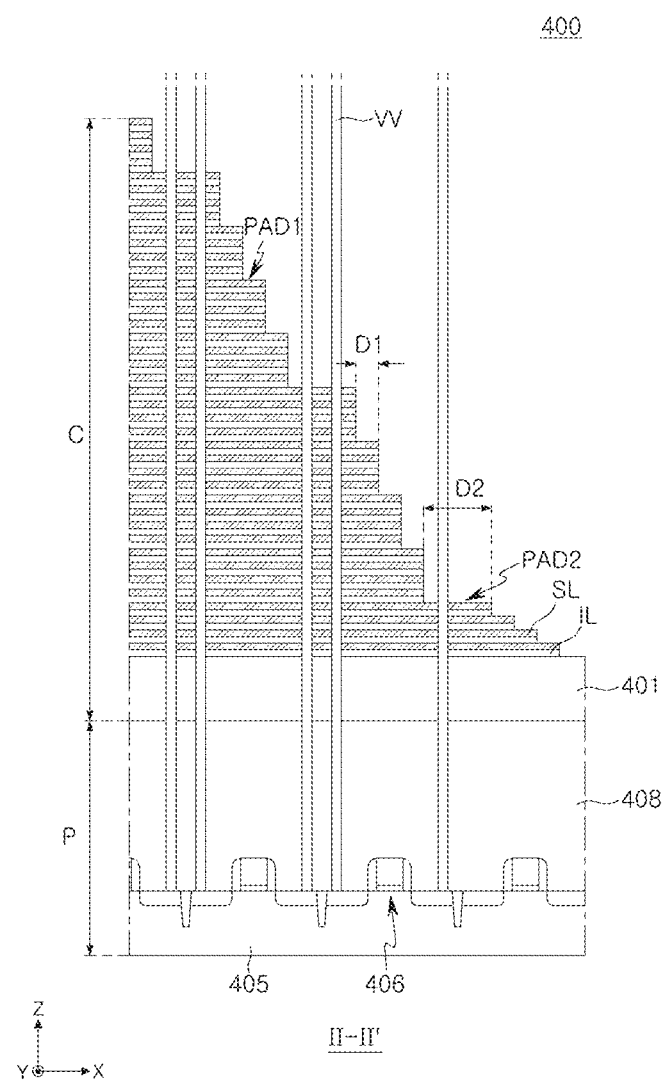
FIG. 16 is a cross-sectional view taken along line II-II' in FIG. 11.
Figure 17:
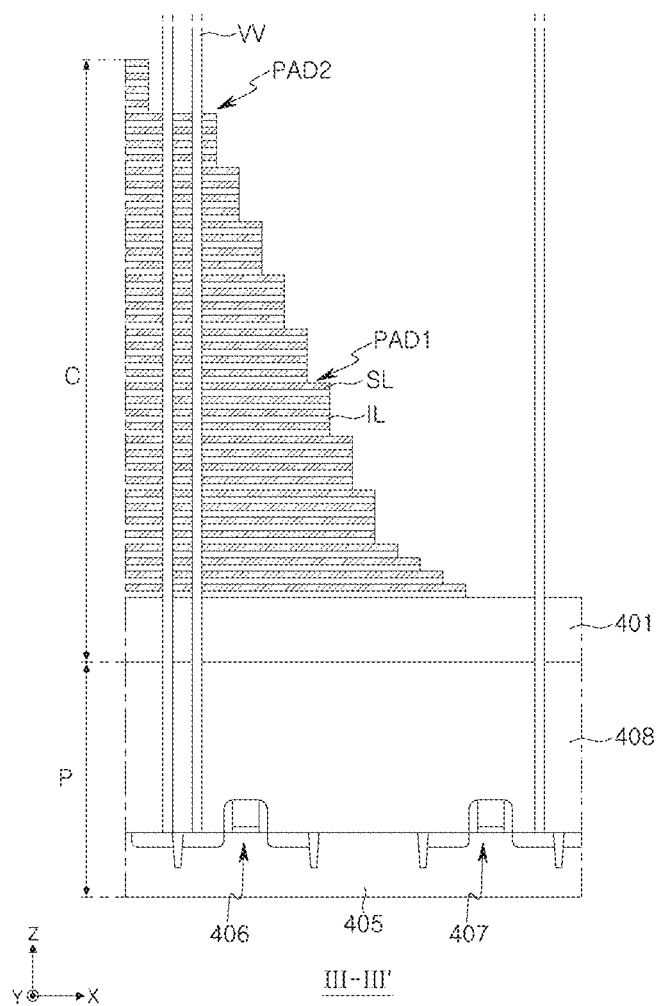
FIG. 17 is a cross-sectional view taken along line in FIG. 12.
Figure 18A:
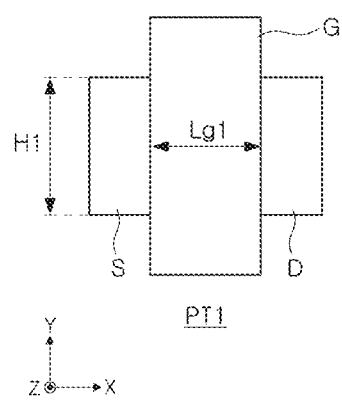
FIGS. 18A and 18B is a schematic diagram of pass elements illustrated in FIG. 17.
Figure 18B:
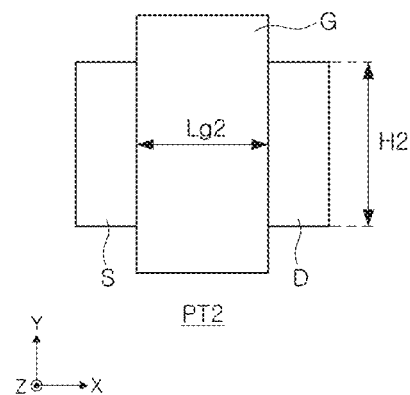

FIGS. 11 to 14 are schematic plan views of a memory device according to some example embodiments. FIG. 15 is a cross-sectional view taken along line I-I' in FIG. 11, and FIG. 16 is a cross-sectional view taken along line II-II' in FIG. 11. FIG. 17 is a cross-sectional view taken along line III-III' in FIG. 12, and FIGS. 18A and 18B are schematic diagrams of pass elements illustrated in FIG. 17.

Referring to FIGS. 11 and 12, a memory device 400 may include a first memory block 410 and a second memory block 420. Each of the first memory block 410 and the second memory block 420 may include a cell array region CA and a first cell contact region CT1 and a second cell contact region CT2 disposed on both sides of the cell array region CA in a first direction (an X-axis direction). The first memory block 410 and the second memory block 420 may be adjacent to each other in a second direction (a Y-axis direction).

Each of the first cell contact region CT1 and the second cell contact region CT2 may include a first connection region CR1 and a second connection region CR2. Referring to FIGS. 11 and 12, the first cell contact region CT1 of the first memory block 410 may provide a first connection region CR1, and the second cell contact region CT2 of the first memory block 410 may provide a second connection region CR2. The first cell contact region CT1 of the second memory block 420 may provide a second connection region CR2, and the second cell contact region CT2 of the second memory block 420 may provide a first connection region CR1.

First pads PAD1 and second pads PAD2 may be formed in the first connection region CR1 and the second connection region CR2. In the first connection region CR1, the first pads PAD1 and the second pads PAD2 form steps in the first direction and a second direction. In the second connection region CR2, the PAD1 and the second pads PAD2 may form steps in the first direction.

Each of the second pads PAD2 may have an area larger than an area of each of the first pads PAD1. As an example, the second pads PAD2 may extend to be longer than the first pads PAD1 in the first direction. The first pads PAD1 and the second pads PAD2 illustrated in FIGS. 11 and 12 may be example embodiments, and lengths of the first pads PAD1 and the second pads PAD2 may be variously changed. As an example, length of each of the second pads PAD2 in the first direction may be at least 10 times the length of each of the first pads PAD1 in the first direction.

The first memory block 410 and the second memory block 420 may include a plurality of wordlines WL stacked in a third direction (a Z-axis direction). In the cell array region CA, a plurality of channel structures CH may be provided to extend in the third direction and to penetrate through the wordlines WL. The plurality of wordlines WL may be divided into a first memory block 410 and a second memory block 420 by wordline cuts WC.

First cut lines CL1 and second cut lines CL2 may be provided between wordline cuts WC, closest to each other, in the second direction. The first cut lines CL1 may be formed in the cell array region CA as well as the cell contact regions CT1 and CT2, while the second cut lines CL2 may only be formed in the cell contact regions CT2. In the example embodiments illustrated in FIGS. 11 and 12, the second cut lines CL2 may not be formed in the second connection region CR2.

In the first pads PAD1 and the second pads PAD2 formed in the first connection region CR1, the wordlines WL may be connected to cell contacts CC. At least a portion of the cell contacts CC may be connected to at least a portion of a plurality of vertical vias VV formed in the second connection region CR2. In the cell array region CA, the vertical vias VV may be connected to the cell array region CA and circuit elements below the contact regions CT1 and CT2. As an example, the vertical vias VV may be connected to pass elements disposed below the contact regions CT1 and CT2. The number and arrangement of the vertical vias VV are not limited to those illustrated in FIGS. 11 and 12, and the vertical vias VV may be variously disposed in the second connection region CR2. The number and arrangement of vertical vias VV may be determined in consideration of routing of the wordlines WL.

As described above, among the first and second cut lines CL1 and CL2, the second cult lines CL2 may not be formed in the second connection region CR2. Accordingly, a process of introducing phosphoric acid through trenches for forming the wordline cuts WC and the first and second cut lines CL1 and CL2 to replace sacrificial layers with wordlines WL may not be performed in a portion of the second connection region CR2. The vertical vias VV may extend in the third direction in a region, in which the wordlines WL are not formed and the sacrificial layers remain, to be connected to underlying pass elements.

Referring to FIG. 11, the first cell contact region CT1 may include five second pads PAD2 arranged in the first direction. Referring to FIG. 12, a second cell contact region CT2 may include three second pads PAD2 arranged in a first direction. Accordingly, the first memory block 410 and the second memory block 420 may have a structure asymmetrical about a cell array region CA in the first direction.

Referring to FIGS. 11 and 12, among the second pads PAD2 included in the first cell contact region CT1, a portion of second pads PAD2 distant away from the cell array region CA may be omitted in the second contact region CT2 in consideration of routing of cell contacts CC, connected to the wordlines WL, and vertical vias VV connected to the cell contacts CC. In some example embodiments, when the channel structures CH include lower channel structures and upper channel structures connected to each other in the third direction, the second pads PAD2 included in the second cell contact region CT2 may be provided only by upper wordlines through which the upper channel structures penetrate. For example, lower wordlines, through which the lower channel structures penetrate, may provide only the first pads PAD1.

Since the number of the second pads PAD2, included in the second cell contact region CT2, is smaller than the number of the first cell contact region CT1, there is a need for an additional method of disposing vertical vias VV to connect the cell contacts CC and the pass elements to each other. In some example embodiments, vertical vias VV may be disposed between the second cell contact regions CT2 adjacent to each other in the first direction to be connected to the cell contacts CC. The pass elements, disposed between the second cell contact regions CT2 adjacent to each other in the first direction, may be commonly connected to at least a portion of wordlines, among wordlines of memory blocks different from each other, to address a connection issue of the cell contacts CC and the pass elements. Hereinafter, this will be described with reference to FIGS. 13 and 14.

Figure 13:
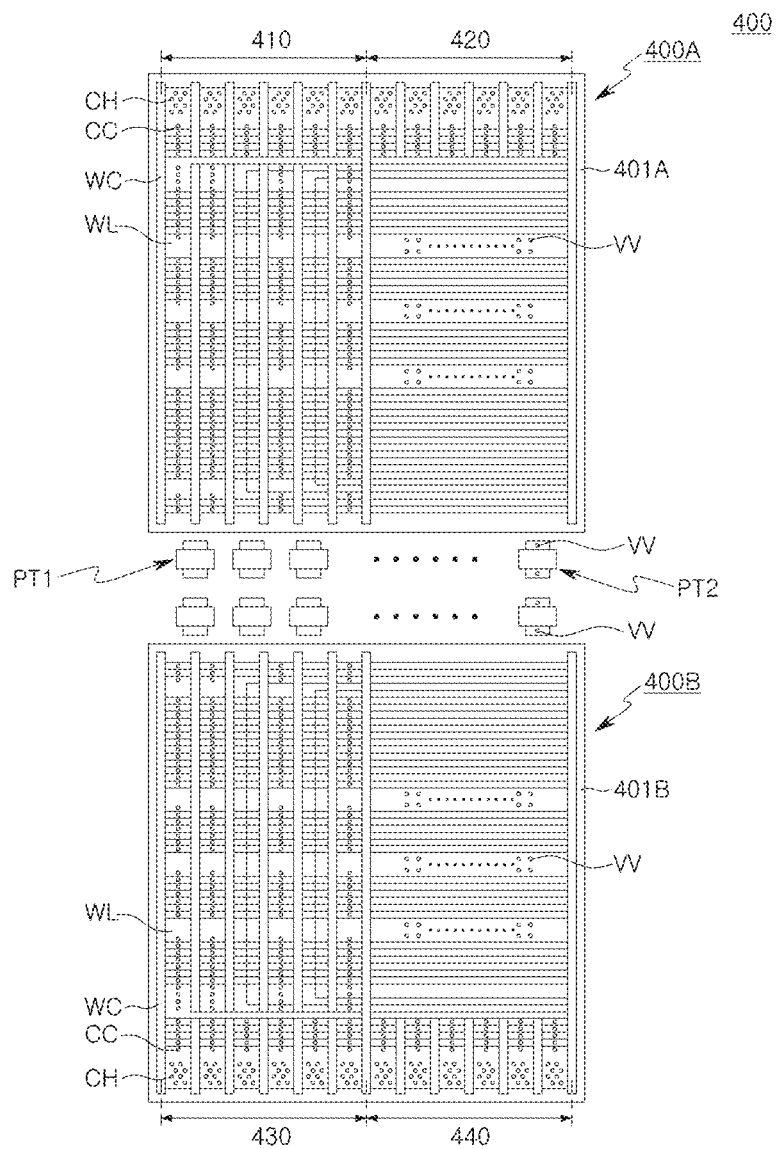
Figure 14:
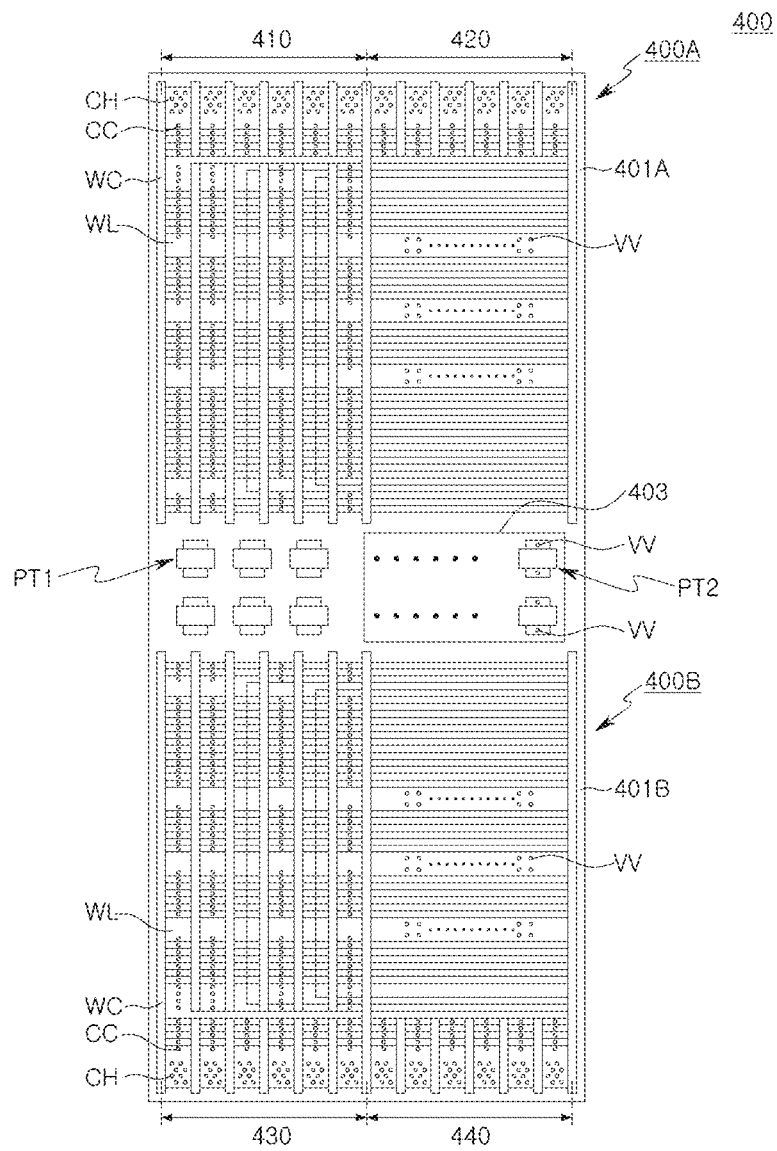

Referring to FIGS. 13 and 14, the memory device 400 may include first to fourth memory blocks 410 to 440. A first connection region CR1 of the first memory block 410 and a first connection region CR1 of the third memory blocks 430 may be adjacent to each other in the first direction, and a second connection region CR2 of the second memory block 420 and a second connection region CR2 of the fourth memory blocks 440 may be adjacent to each other in the first direction.

Pass elements PT1 and PT2 may be disposed between a first cell region 400A, having the first memory block 410 and the second memory block 420, and a second cell region having the third memory block 430 and the fourth memory block 440. The pass elements PT1 and PT2 may be formed in a peripheral circuit region disposed below cell regions 400A and 400B, and may include first pass elements T1 and second pass elements PT2.

At least a portion of the second pass elements PT2 may include at least a portion of the wordlines WL of the first memory region 410, and at least a portion of the wordlines WL of the third memory region 430. The second pass elements PT2 may be disposed between the second connection region CR2 of the first cell region 400A and the second connection region CR2 of the second cell region 400B to reduce the complexity of interconnection lines connecting at least a portion of the wordlines WL and the second pass elements PT2 to each other.

In the example embodiments illustrated in FIG. 13, the first cell region 400A and the second cell region 400B may be disposed on different second substrates 401A and 401B. Meanwhile, in the example embodiments illustrated in FIG. 14, the first cell region 400A and the second cell region 400B may be disposed on one second substrate 401. Accordingly, in the example embodiments illustrated in FIG. 14, the vertical vias VV connected to the second pass elements PT2 may penetrate through the second substrate 401. In some example embodiments, a substrate insulating layer 403 may be formed on the second substrate 401 such that the vertical vias VV and the second substrate 401A are isolated from each other.

FIG. 15 may be a cross-sectional view taken along line I-I' in FIG. 11. Referring to FIGS. 15 and 16 together with FIG. 11, the memory device 400 may include a peripheral circuit region P and a cell region C above the peripheral circuit region P. The peripheral circuit region P may include a first substrate 405 and circuit elements formed on the first substrate 405. For example, the circuit elements may be pass elements 406 included in a row decoder and electrically connected to wordlines WL, and may be covered with a lower interlayer dielectric 408.

The cell region C may be formed in a second substrate 401 on the lower interlayer dielectric 408. In FIG. 15, the cross section, taken along line I-I' in FIG. 11, may correspond to the second connection region CR2 of the memory device 400. Second lines CL2 may not be formed and sacrificial layers SL may not be removed and remain in the second connection region CR2. Accordingly, as illustrated in FIG. 15, the sacrificial layers SL and insulating layers IL may be alternatingly stacked on the second substrate 401. The sacrificial layers SL and the insulating layers IL may include insulating materials different from each other.

In the second connection region CR2, the sacrificial layers SL and the insulating layers IL may provide the first pads PAD1 and the second pads PAD2. A length D1 of each of the first pads PAD1 may be less than a length of each of the second pads PAD2 in the first direction (the X-axis direction). Vertical vias VV may be formed in the second pads PAD2, and may extend to the peripheral circuit region P to be connected to the pass elements 406. In a region through which the vertical vias VV penetrates, the second substrate 401 may be formed of an insulating material.

FIG. 16 may a cross-sectional view taken along line II-II' in FIG. 11, and FIG. 17 may be a cross-sectional view taken along line in FIG. 12. Referring to FIGS. 11 and 12, FIG. 16 may be a cross-sectional view illustrating a portion of the second connection region CR2 of the first cell contact region CT1, and FIG. 17 may be a cross-sectional view illustrating a portion of the second connection region CR2 of the second cell contact region CT2.

In some example embodiments, the second connection region CR2 of the first cell contact region CT1 and the second connection region CR2 of the second cell contact region CT2 may have structures different from each other. Referring to FIGS. 16 and 17, the second connection region CR2 of the first cell contact region CT1 and the second connection region CR2 of the second cell contact region CT2 may have structures different from each other at a specific height, from an upper surface of the second substrate 401, or less. Such a difference in structure may be caused by a difference between the number of the second pads PAD2, included in the second connection region CR2 of the first cell contact region CT1, and the number of the second pads PAD2 included in the second connection region CR2 of the second cell contact region CT2.

In some example embodiments, the number of the second pads PAD2, included in the second connection region CR2 of the first cell contact region CT1, may be greater than the number of the second pads PAD2 included in the second connection region CR2 of the second cell contact region CT2. Since the second connection region CR2 of the first cell contact region CT1 may include the greater number of the second pads PAD2 than the second connection region CR2 of the second cell contact region CT2, the first cell contact region CT1 may extend to be longer than the second cell contact region CT2 in the first direction. Accordingly, a length of at least one of the wordlines WL extending to the first cell contact region CT1, a first side, of the cell array region CA in the first direction may be different from a length of at least one of the wordlines WL extending to the second cell contact region CT2, a second side, of the cell array region CA in the first direction. For example, a lowermost wordline WL may extend in the first direction to be longer than the second cell contact region CT2 in the first cell contact region CT1.

As an example, a difference between the number of the second pads PAD2, included in the second connection region CR2 of the first cell contact area CT1, and the number of the second pads PAD2, included in the second connection region CR2 of the second cell contact area CT2, may be two or more. In some example embodiments, a length of the second cell contact region CT2 in the first direction may be greater than 0.6 times and less than 0.9 times a length of the first cell contact region CT1 in the first direction. In some example embodiments, a length of each of the second pads PAD2 in the first direction may be greater than or equal to ten times a length of each of the first pads PAD1 in the first direction. As compared with the first cell contact area CT1, the number of the second pads PAD2, included in the cell contact region CT2, may be reduced by two or more to obtain the above-described length reduction effect.

Referring to FIG. 17, the pass elements 406 and 407 may include a first pass element 406 and a second pass element 407. The second pass element 407 may be disposed outwardly of the second connection region CR2 of the second cell contact region CT2 in the first direction, and may include at least two wordlines WL through vertical vias VV. The second pass element 407 may be connected to two or more wordlines WL and the number of second pads PAD2, included in the second connection region CR2 of the second cell contact region CT2, may be reduced. Thus, the integration density of the memory device 400 may be increased.

Since the second pass element 407 may be connected to two or more wordlines WL to simultaneously drive the two or more wordlines WL, the second pass element 407 may have a shape or/and a size different from a shape of the first pass element 406. Referring to FIGS. 18A and 18B, each of the first pass element 406 and the second pass element 407 may include a gate G, and a source region S and a drain region D on opposite sides adjacent to the gate G. As an example, a gate length Lg2 of the second pass element 407 may be greater than a gate length Lg1 of the first pass element 406. In some example embodiments, a length H2 of the source region S and the drain region D of the second pass element 407 in the second direction may be greater than a length H1 of the source region S and the drain region D of the first pass element 406 in the second direction.

Figure 19:
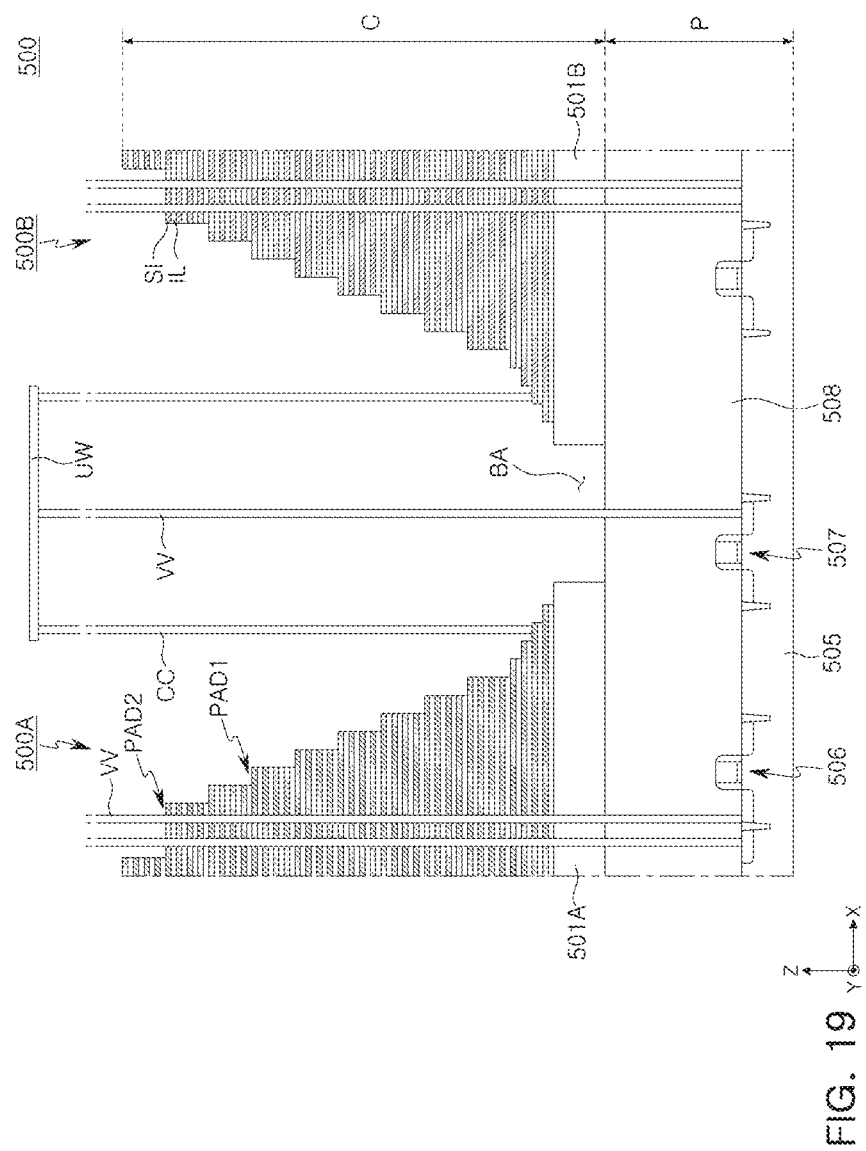
FIGS. 19 and 20 are cross-sectional views illustrating a cell contact region of a memory device according to some example embodiments.
Figure 20:
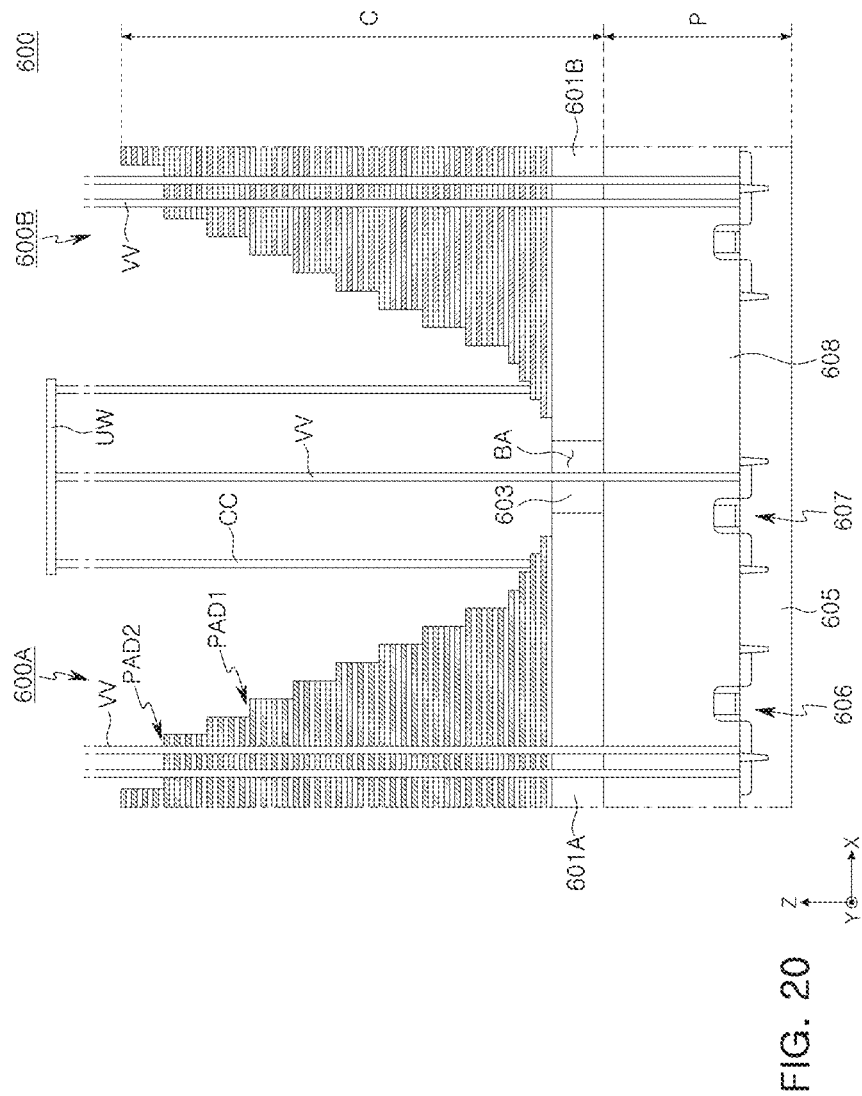

FIGS. 19 and 20 are cross-sectional views illustrating a cell contact region of a memory device according to some example embodiments.

Referring to FIG. 19, a memory device 500 may include a peripheral circuit region P and a cell region C stacked in a third direction (a Z-axis direction). The peripheral circuit region P may include a first substrate 505, circuit elements 506 and 507 formed on the first substrate 505, a lower interlayer dielectric 508 covering the circuit elements 506 and 507, and the like. As an example, the circuit elements 506 and 507 may be pass elements included in a row decoder.

A cell region C may include a first cell region 500A and a second cell region 500B. In addition, the cell region C may include a plurality of second substrates 501A and 501B, and a plurality of sacrificial layers SL and a plurality of insulating layers IL stacked on the plurality of second substrates 501a and 510B. The sacrificial layers SL and the insulating layers IL may provide steps in a first direction (an X-axis direction) and a second direction (a Y-axis direction), and the first pads PAD1 and the second pads PAD2 may be formed by the steps. Each of the first pads PAD1 may have a length shorter than a length of each of the second pads PAD2 in the first direction.

In the example embodiments illustrated in FIG. 19, the sacrificial layers SL may be layers remaining without being removed in a process of forming wordlines. The sacrificial layers SL may remain in a region in which a plurality of vertical vias VV are formed. In a region in which the vertical vias VV are not formed, the sacrificial layers SL may be replaced with wordlines. The vertical vias VV may be connected to the pass elements 506 and 507 through the sacrificial layers SL and the insulating layers IL.

As an example, at least one of the vertical vias VV may be connected to the first pass element 506 through the sacrificial layers SL and the insulating layers IL in the second pads PAD2. At least one of the vertical vias VV may be connected to the second pass element 507 in a boundary region BA between the second substrate 501A of the first cell region 500A and the second substrate 501B of the second cell region 500B.

The second pass element 507 may be connected to a pair of wordlines, included in the first cell region 500A and the second cell region 500B, through a vertical via VV, an upper interconnection line UW, and a cell contact CC. As an example, the pair of wordlines may be disposed at the same height in a third direction. In the example embodiments illustrated in FIG. 19, the pair of wordlines may be disposed rearward of the sacrificial layers SL in a second direction.

Referring to FIG. 20, a memory device 600 may include a peripheral circuit region P and a cell region C. Configurations of the peripheral circuit region P and the cell region C may be similar to those of the memory device 500 described above with reference to FIG. 19. For example, the cell region C may include a first cell region 600A and a second cell region 600B adjacent to each other in a first direction.

In the example embodiments illustrated in FIG. 20, the first cell region 600A and the second cell region 600B may be disposed on one second substrate 601. For example, the second substrate 601 may extend from the first cell region 600A to the second cell region 600B. At least one of the vertical vias VV may penetrates through a substrate insulating layer 603, formed in the boundary region BA between the first cell region 600A and the second cell region 600B, to extend to the peripheral circuit region P.

Each wordline in the memory devices 500 and 600 may have substantially the same thickness as each sacrificial layer SL. A gate length of each memory cell may be determined by the thickness of each wordlines, and characteristics of each memory cell may vary depending on the thickness of each wordline. In example embodiments, the thickness of each wordline may vary depending on whether each wordlines is independently connected to first pass elements 506 and 606 or shares second pass element 507 and 607 with at least one of the other wordlines, where wordlines are arranged in a cell region C in a third direction, or the like.

Figure 21:
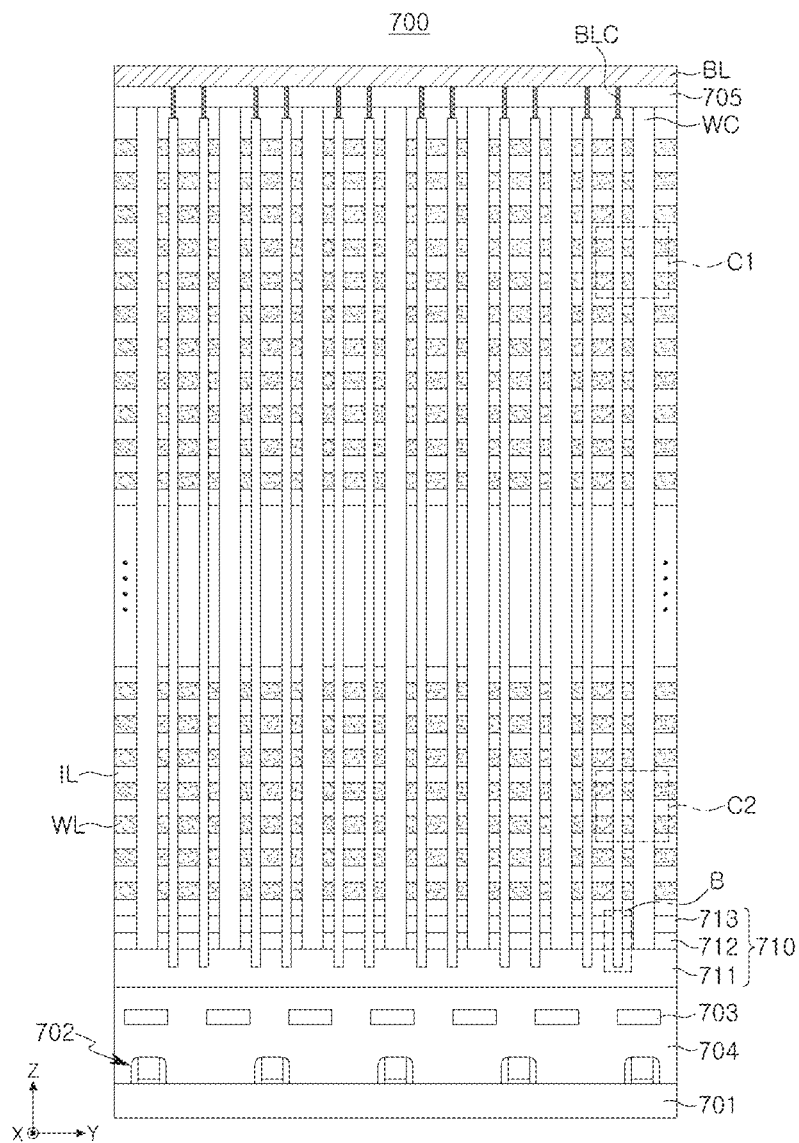
FIG. 21 is a cross-sectional view illustrating a cell array region of a memory device according to some example embodiments.

FIG. 21 is a cross-sectional view illustrating a cell array region of a memory device according to some example embodiments.

Referring to FIG. 21, a memory device 700 may include a peripheral circuit region P and a cell region C, and the cell region C may be disposed above the peripheral circuit region P. The peripheral circuit region P includes a first substrate 701, circuit elements 702 formed on the first substrate 701, lower interconnection lines 703 connected to the circuit elements 702, a lower interlayer dielectric 704, and the like. As an example, the circuit elements 702 may provide a page buffer or the like.

The cell region C may include wordlines WL stacked on a second substrate 710, channel structures CH penetrating through the wordlines WL, and wordline cuts WC dividing the wordlines WL into a plurality of regions. The wordlines WL may be stacked alternatingly with insulating layers IL, and may extend in a first direction (an X-axis direction) and a second direction (a Y-axis direction) to form pads having steps. As described above in various embodiments, the pads may include first pads and second pads, and each of the first pads may have a length shorter than a length of each of the second pads in the first direction. As an example, the memory device 700 illustrated in FIG. 21 may include the first cell contact region and the second cell contact region described above with reference to FIGS. 11 and 12, and the first cell contact region and the second cell contact region may be disposed on both sides of a cell region C in the first direction.

The channel structures CH may be connected to a bitline BL by a bitline contact BLC. In FIG. 21, channel structures CH, disposed in the same location in the first direction, are illustrated as being connected to one bitline BL. However, the location of the channel structures CH is not limited thereto. The bitline contact BLC may penetrate through an upper interlayer dielectric 705 to connect the channel structures CH and the bitline BL to each other.

The second substrate 710 may include first to third layers 711 to 713. The channel structures CH, disposed between the wordline cuts WC, may be connected to each other by the first to third layers 711 to 713 to be connected to a single common source line. Hereinafter, the memory device 700, illustrated in FIG. 21, will be described in further detail with reference to FIGS. 22 to 24.

Figure 22:
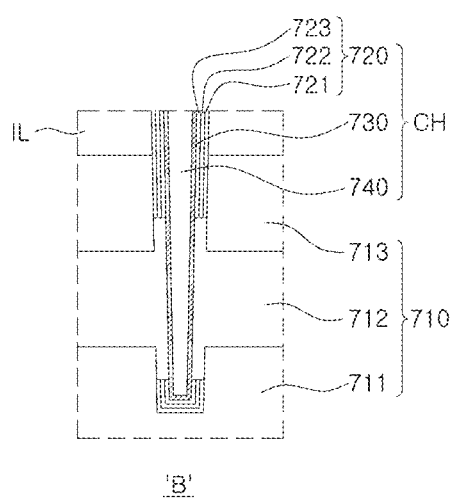
FIGS. 22 to 24B are enlarged views of a region in FIG. 21.

FIGS. 22 to 24B are enlarged views of a region in FIG. 21;

FIG. 22 may be an enlarged view of region B in FIG. 21. Referring to FIG. 22, a second substrate 710 may include first to third layers 711 to 713. A channel structure CH may include a data storage layer 720, a channel layer 730, a buried insulating layer 740, and the like.

Each of the first to third layers 711 to 713 of the second substrate 710 may include polysilicon doped with impurities having a first conductivity type. As an example, the first to third layers 711 to 713 may be doped with N-type impurities. Referring to FIG. 21, among the first to third layers 711 to 713 included in the second substrate 710, the first layer 711 and the second layer 712 may be isolated from each other by wordline cuts WC in a second direction. Accordingly, channel structures CH, disposed between a pair of wordline cuts WC adjacent to each other in a second direction, may be connected to each other by the second substrate 710.

The data storage layer 720 may include a plurality of layers 721 to 723. As an example, the data storage layer 720 may include a blocking layer 721, a charge storage layer 722, and a tunneling layer 723. The number, disposition order, material of the layers 721 to 723, included in the data storage layer 720, may be variously changed. The channel layer 730 may be formed of a semiconductor material, for example, polysilicon, or the like, and an internal space of the channel layer 730 may be filled with a buried insulating layer 740 such as a silicon oxide or the like.

Figure 23A:
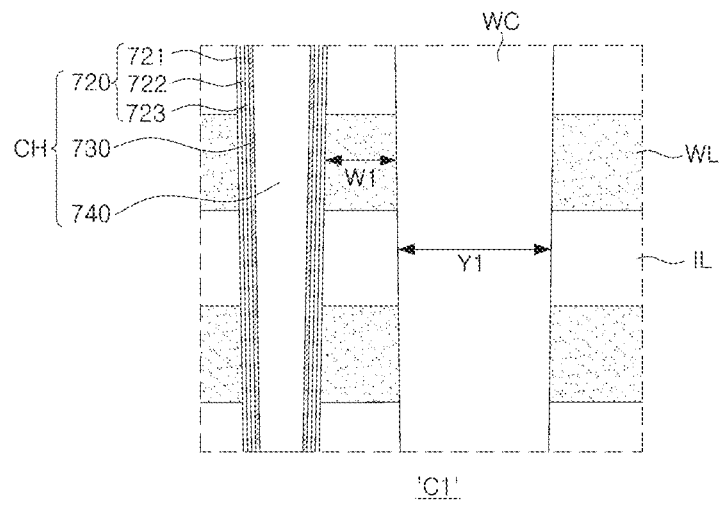
Figure 23B:
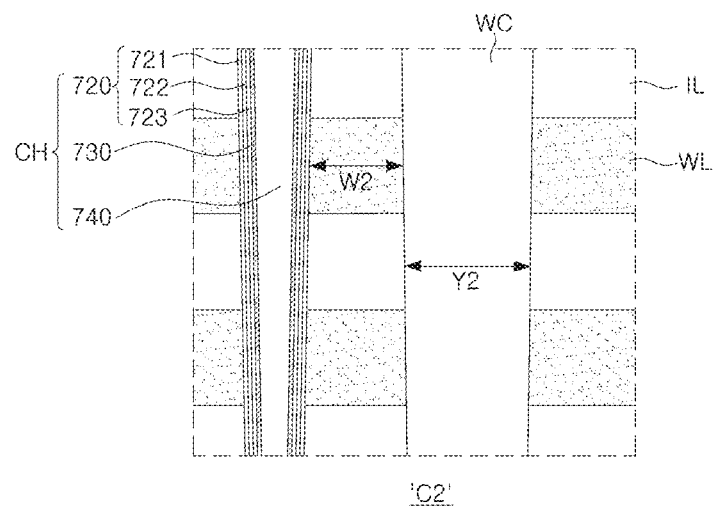

FIGS. 23A and 23B may be an enlarged view of regions C1 and C2 in FIG. 21. Referring to FIGS. 23A and 23B, a channel structure CH may penetrate through wordlines WL and insulating layers IL, and the wordlines WL and the insulating layers IL may be divided into a plurality of regions by wordline cut WC.

In the memory device 700 according to the example embodiments illustrated in FIG. 21, the channel structures CH and the wordline cuts WC may have a shape in which widths thereof are decreased in a third direction (a Z direction) toward the second substrate 710. For example, side surfaces of the channel structures CH and the wordline cuts WC on a cross section may not be fully perpendicular to an upper surface of the second substrate 710 and may have a gently sloped shape. Referring to FIGS. 23A and 23B, the wordline cut WC has a first width Y1 in a region C1, disposed in a relatively higher location, and a second width Y2, less than the first width Y1, in a region C2 disposed in a relatively lower location.

Accordingly, as illustrated in FIGS. 23A and 23B, a first width W1 of the wordline WL disposed in the region C1 may be less than a second width of the wordline WL disposed in the region C2. Due to the difference in width, resistance of the wordline WL in the region C1 may be higher than resistance of the wordline WL in the region C2. In some example embodiments, a connection relationship between wordlines WL and pass elements may be determined in consideration of a difference in resistance between the wordlines WL.

The memory device 700 according to some example embodiments may include first pass elements and second pass elements disposed in the peripheral circuit region P, and each of the second pass elements may be connected to at least two wordlines WL. As described above, each of the second pass elements may be shared by wordlines WL disposed at the same height in cell regions different from each other. On the other hand, each of the first pass elements may be connected to a single wordline WL.

In some example embodiments, the second pass elements may be connected to wordlines WL having relatively lower resistance. For example, in the example embodiments illustrated in FIGS. 23A and 23B, wordlines WL in the region C1 having relatively higher resistance may be connected to first pass elements, and wordlines WL in the region C2 having relatively lower resistance may be connected to second pass elements. In one cell region C of the memory device 700, the number of the wordlines WL, connected to the first pass elements, may be greater than the number of the wordlines WL connected to the second pass elements.

Figure 24A:
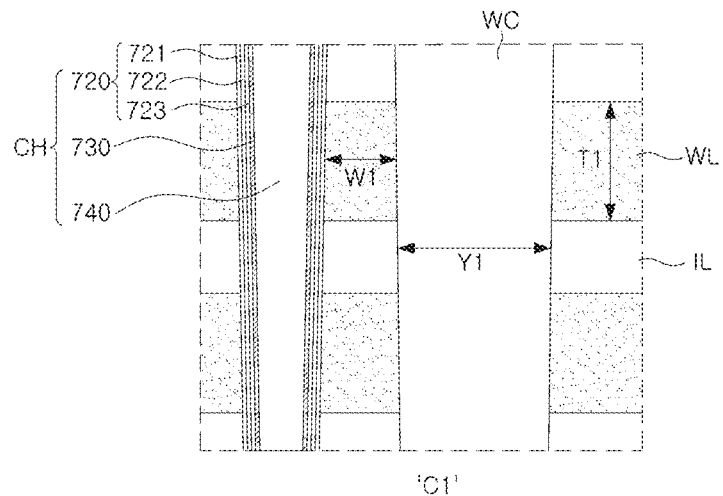
Figure 24B:
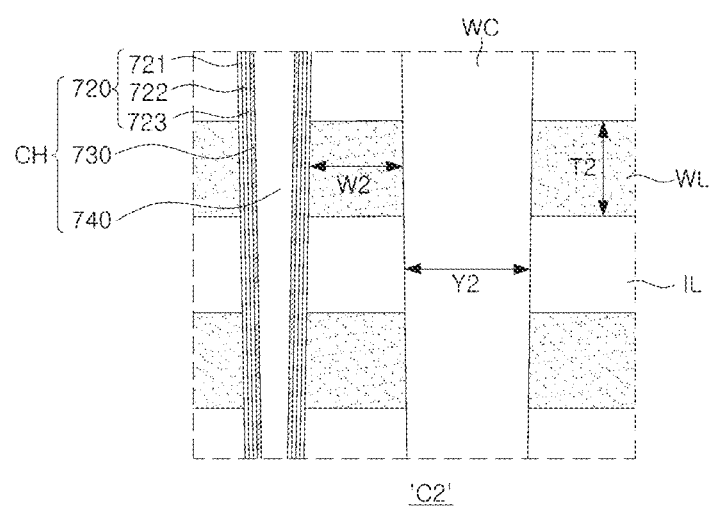

In some example embodiments, at least a portion of the wordlines WL may be formed to have thicknesses different from each other to reduce a resistance characteristic deviation of the wordlines WL. Referring to FIGS. 24A and 24B, wordlines WL in a region C1 may be formed to have a first thickness T1, and wordlines WL in a region C2 may be formed to have a second thickness T2. The first thickness T1 may be higher than the second thickness T2.

Therefore, in the example embodiments illustrated in FIGS. 24A and 24B, a difference between resistance of the wordlines WL in the region C1 and resistance of the wordlines WL in the region C2 may be reduced. As necessary, the wordlines WL in the region C1 may also be connected to the second pass elements. As an example, the wordlines WL in the region C1 may be connected to the second pass elements, and the wordlines WL in the region C2 may be connected to the first pass elements.

Alternatively, in contrast to the example embodiments illustrated in FIGS. 24A and 24B, each of the wordlines WL in the region C2 may be formed to have a thickness higher than a thickness of each of the wordlines WL in the region C1, and the wordlines WL in the region C2 may be connected to the second pass elements. Since the resistance of the wordlines WL in the region C2 connected to the second pass elements is reduced, a load of the second pass elements may be reduced and, according to example embodiments, the second pass elements may be formed to have the same size as the first pass elements.

Figure 25:
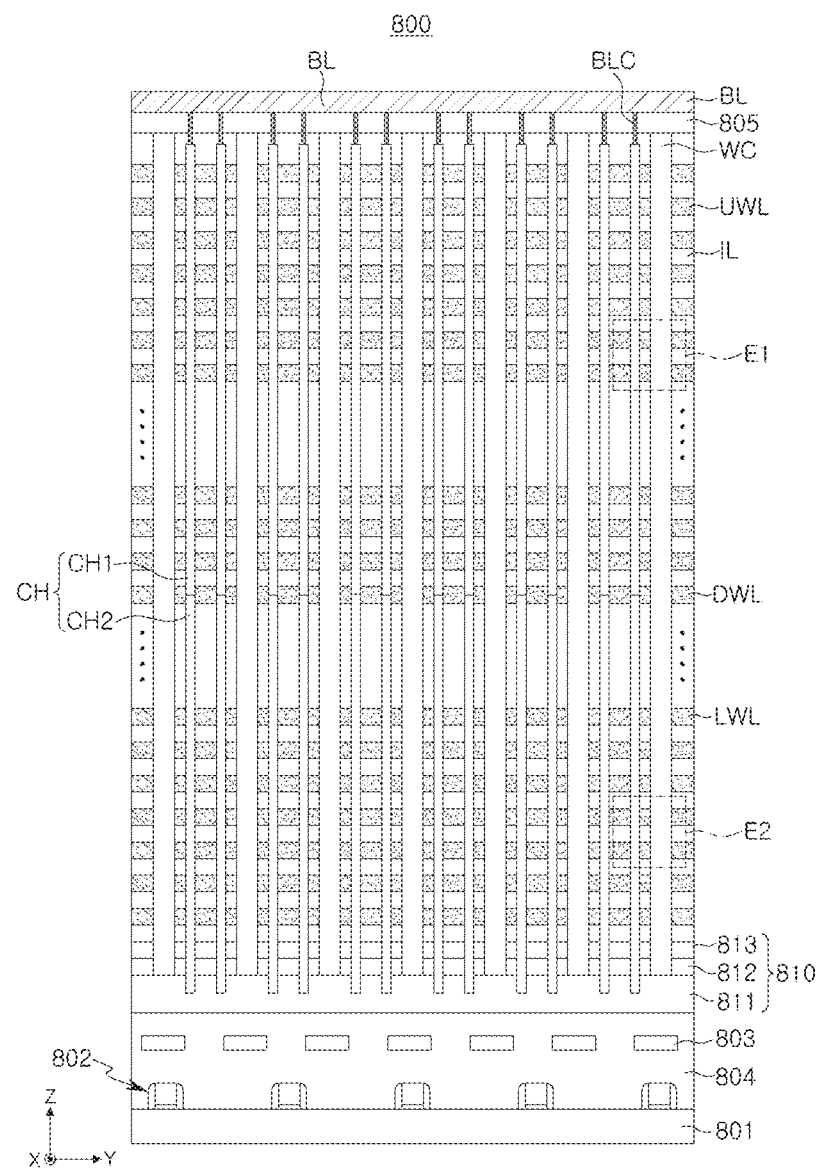
FIG. 25 is a cross-sectional view illustrating a cell array region of a memory device according to some example embodiments.

FIG. 25 is a cross-sectional view illustrating a cell array region of a memory device according to some example embodiments.

Referring to FIG. 25, a memory device 800 may include a peripheral circuit region P and a cell region C, and the cell region C may be disposed above the peripheral circuit region P. A configuration of the peripheral circuit region P may be similar to the configuration of the peripheral circuit region P in the memory device 700 described with reference to FIG. 21.

The cell region C may include wordlines LWL, DWL, and UWL stacked on a second substrate 810, channel structures CH penetrating through the wordlines LWL, DWL, and UWL, and wordline cuts WC dividing the wordlines LWL, DWL, and UWL into a plurality of regions. The second substrate 810 may include first to third layers 811 to 813, and the configuration of the second substrate 810 may be understood with reference to the contents described with reference to FIG. 22.

The wordlines LWL, DWL, and UWL may include lower wordlines LWL, at least one dummy wordline DWL, and upper wordlines UWL. The lower wordlines LWL may be stacked from an upper surface of the second substrate 810, and lower channel structures CH2, extending from the upper surface of the second substrate 810, may penetrate through the lower wordlines LWL. The upper wordlines UWL may be stacked on the lower wordlines LWL, and an upper channel structures CH1, extending from the lower channel structures CH2, may penetrate through the upper wordlines UWL.

The dummy wordline DWL may be disposed between the lower wordlines LWL and the upper wordlines UWL. As an example, a boundary region between the upper channel structures CH1 and the lower channel structures CH2 may be buried in the dummy wordline DWL. According to example embodiments, another dummy wordline DWL may be added in various locations.

In the memory device 800 according to the example embodiments illustrated in FIG. 25, the channel structures CH may be formed by dividing the channel structures CH into an upper channel structures CH1 and a lower channel structures CH2. On the other hand, the wordline cuts WC may be formed at one time. Therefore, in a plane parallel to a first direction (an X-axis direction) and a second direction (a Y-axis direction), each of the upper wordlines UWL may have an area smaller than an area of each of the lower wordlines LWL, and resistance of the upper wordlines UWL may be increased. Hereinafter, this will be described in further detail with reference to FIGS. 26 and 27.

FIGS. 26A, 26B, 27A and 27B are enlarged views of a region in FIG. 25.

Figure 26A:
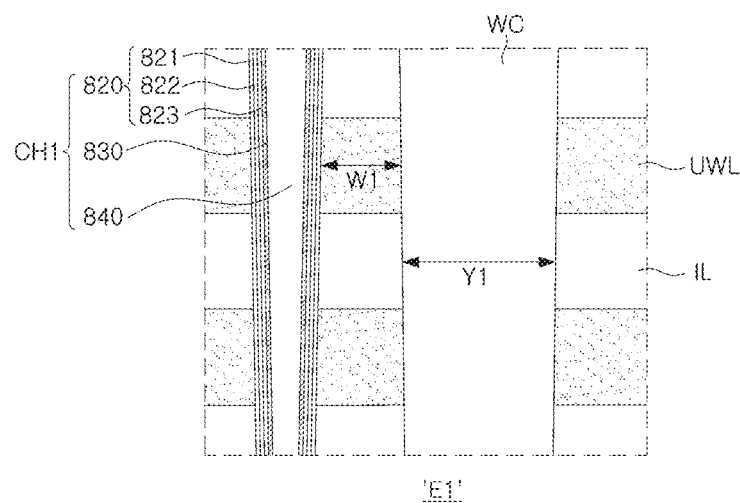
FIGS. 26A, 26B, 27A and 27B are enlarged view of a region in FIG. 25.
Figure 26B:
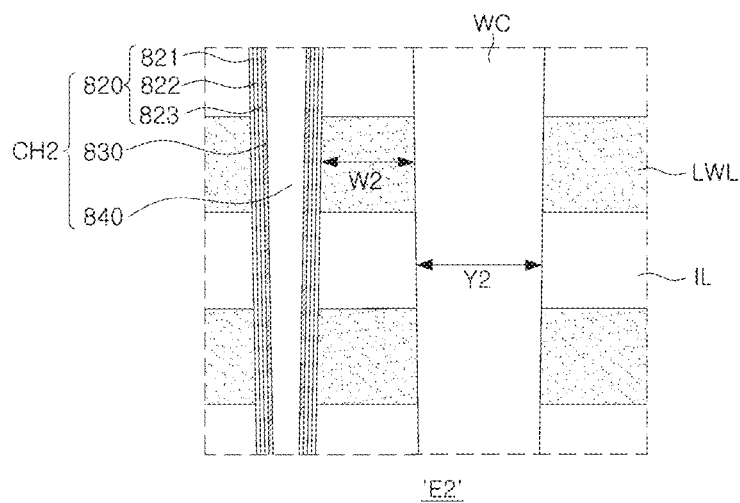

FIGS. 26A and 26B may be an enlarged view of regions E1 and E2 in FIG. 21. Referring to FIG. 26A, an upper channel structure CH1 may penetrate through upper wordlines UWL and insulating layers IL, and the upper wordlines UWL and the insulating layers IL may be divided into a plurality of regions by a wordline cut WC. Similarly, referring to FIG. 26B, a lower channel structure CH2 may penetrate through lower wordlines LWL and insulating layers IL, and the lower wordlines LWL and the insulating layers IL may be divided into a plurality of regions by a wordline cut WC.

Each of the upper channel structure CH1 and the lower channel structure CH2 may include a data storage layer 820, a channel layer 830, a buried insulating layer 840, and the like. The data storage layer 820 may include a blocking layer 821, a charge storage layer 822, a tunneling layer 823, and the like.

As an example, a height from a lower bottom of the upper channel structure CH1 to a region E1 may be the same as a height from a lower surface of the lower channel structure CH2 to a region E2. Therefore, the upper channel structure CH1 and the lower channel structure CH2 may have substantially the same size in each of the regions E1 and E2. However, the wordline cut WC may be formed in one process in the entire cell region C, and width of the wordline cut WC may be gradually decreased in a direction toward the second substrate 810. Referring to FIGS. 26A and 26B, first width Y1 of the wordline cut WC in the region E1 may be greater than second width Y2 of the wordline cut WC in the region E2.

Accordingly, the first width W1 of the upper wordlines UWL in the region E1 may be less than the second width W2 of the lower wordlines LWL in the region E2, and the upper wordlines UWL may have relatively higher resistance than the lower wordlines LWL. In some example embodiments, the upper wordlines UWL may be connected to the first pass elements, and at least a portion of the lower wordlines LWL may be connected to the second pass elements in consideration of resistance characteristics. Each of the first pass elements may be an element connected to one of the upper and lower wordlines UWL and LWL, and each of the second pass elements may be an element connected to two or more lower wordlines LWL different from each other. Two or more lower wordlines LWL, connected to each of the second pass elements, may be included in cell regions C different from each other.

Figure 27A:
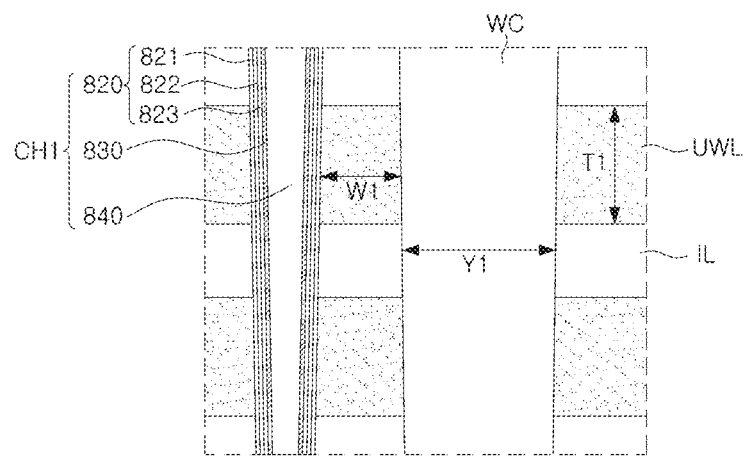
Figure 27B:
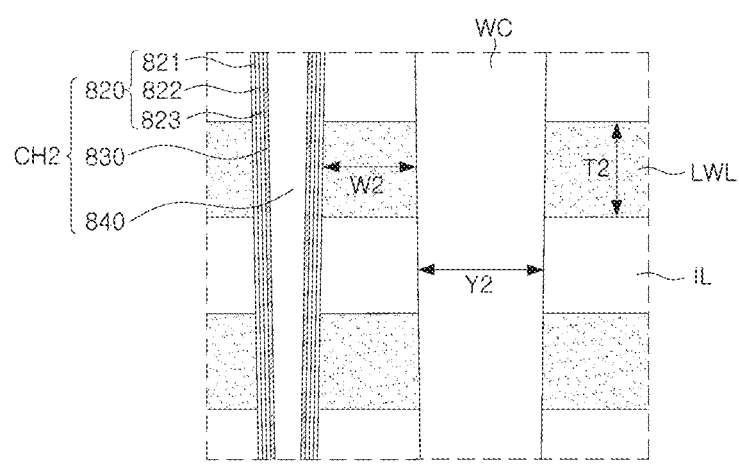

In the example embodiments illustrated in FIGS. 27A and 27B, at least a portion of the upper wordlines UWL may have a thickness higher than a thickness of the lower wordlines LWL. Referring to FIGS. 27A and 27B, each of the upper wordlines UWL may have a first thickness T1, and each of the lower wordlines LWL may have a second thickness T2 less than the first thickness T1. Therefore, the resistance of the upper wordlines UWL may be reduced and, as necessary, the upper wordlines UWL may be connected to the second pass elements. The thicknesses of the upper wordlines UWL and the lower wordlines LWL may be variously changed. For example, the thickness of the lower wordlines LWL, connected to the second pass elements, may be increased to reduce a load of the second pass elements and to improve driving characteristics.

Figure 28:
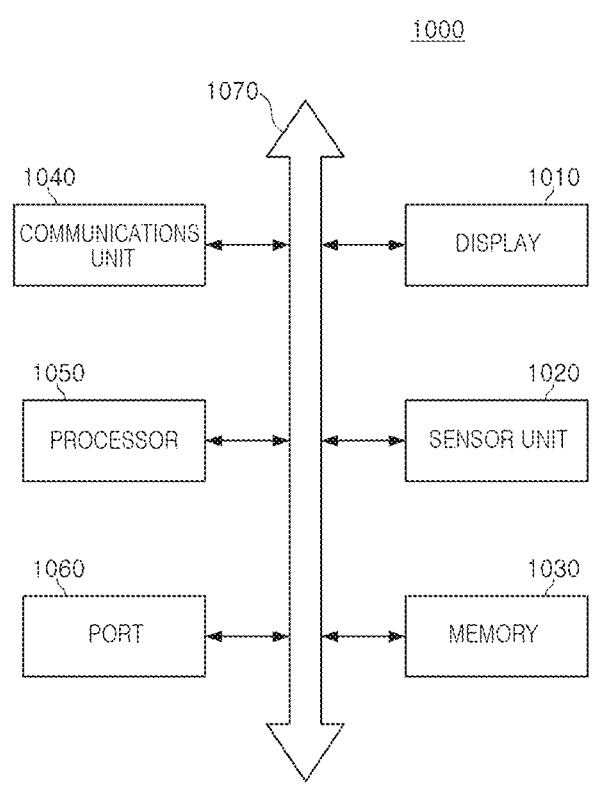
FIG. 28 is a schematic block diagram of an electronic device including a memory device according to some example embodiments.

FIG. 28 is a schematic block diagram of an electronic device including a memory device according to some example embodiments.

An electronic device 1000 according to the example embodiments illustrated in FIG. 28 may includes a display 1010, a sensor unit 1020, a memory 1030, a communications unit 1040, a processor 1050, a port 1060, and the like. The electronic device 1000 may further include a power supply, an input/output device, and the like. Among the components illustrated in FIG. 28, the port 1060 may be provided to allow the electronic device 1000 to communicate with a video card, a sound card, a memory card, a USB device, and the like. The electronic device 1000 may be a comprehensive concept including a typical desktop computer or a laptop computer as well as a smartphone, a tablet PC, a smart wearable device, and the like.

The processor 1050 may perform specific arithmetic operations, commands, tasks, and the like. The processor 1050 may be a central processing unit (CPU), a microprocessor unit (MCU), or a system on chip (SoC), and may communicate with the display 1010, the sensor unit 1020, the memory 1030, the communications unit 1040, and other devices connected to the port 1060, via a bus 1070.

The memory 1030 may be a storage medium configured to store data used for operations of the electronic device 1000, multimedia data, or the like. The memory 1030 may include a volatile memory such as a random access memory (RAM), or a nonvolatile memory such as a flash memory, or the like. The memory 1030 may include at least one of a solid state drive (SSD), a hard disk drive (HDD), and an optical drive (ODD), as a storage device. In the example embodiments illustrated in FIG. 28, the memory 1030 may include a memory device according to various embodiments described above with reference to FIGS. 1 to 27.

Figure 29:
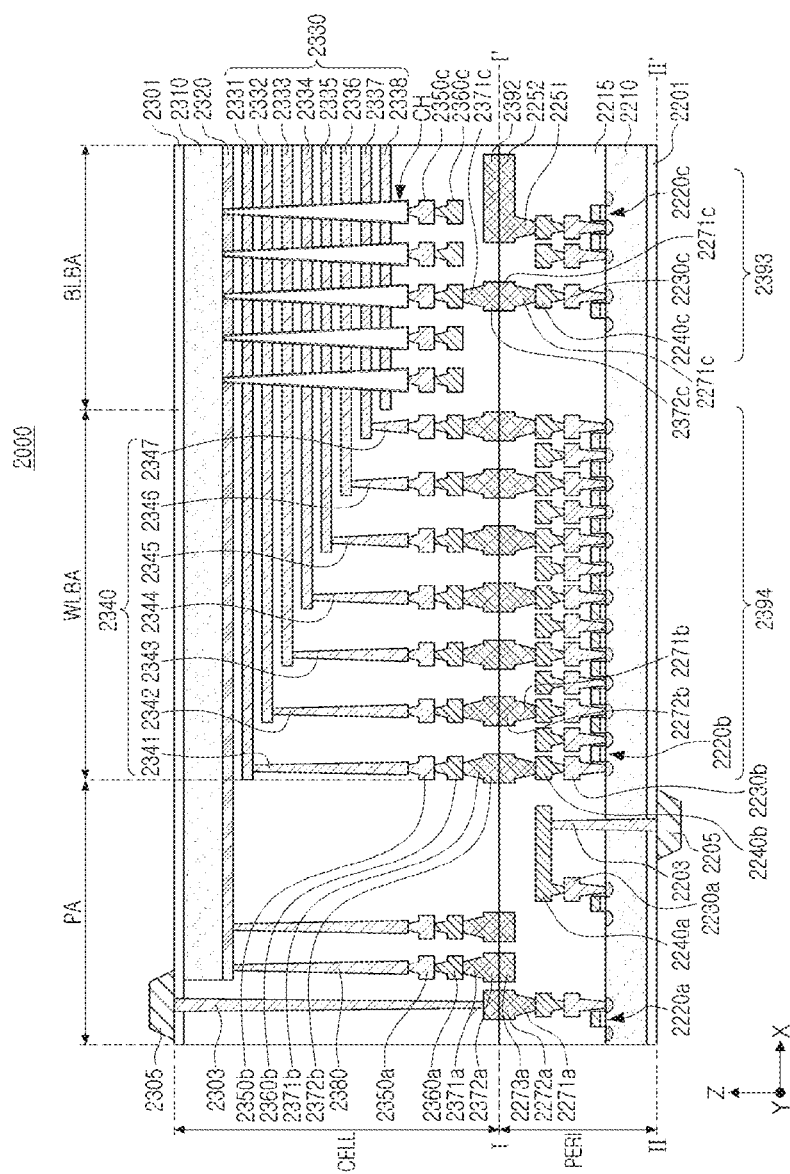
FIG. 29 is a view schematically illustrating a structure of a memory device according to an example embodiment.

Referring to FIG. 29, a memory device 2000 may have a chip-to-chip (C2C) structure. The C2C structure may refer to a structure formed by manufacturing an upper chip including a memory cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the memory cell region CELL of the memory device 2000 may include an external pad bonding area PA, a word line bonding area WLBA, and a bit line bonding area BLBA. The memory cell region CELL may include a cell array region and a cell contact region. The cell array region may be disposed in the bit line bonding area BLBA, and the cell contact region may be disposed in the word line bonding area WLBA. The peripheral circuit region PERI and the memory cell region CELL may be implemented as similar with various embodiments described above with reference to FIGS. 1 to 27. For example, the peripheral circuit region PERI may include a row decoder 2394, and at least a portion of pass elements may be shared by word lines included in different memory blocks being adjacent in a X-direction or a Y-direction.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high resistance, and the second metal layers 2240a, 2240b, and 2240c may be formed of copper having relatively low resistivity.

In an example embodiment illustrate in FIG. 29, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed of aluminum or the like different from copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically connected to upper bonding metals 2371b and 2372b in the memory cell region CELL in a bonding manner, and the lower bonding metals 2271b and 2272b and the upper bonding metals 2371b and 2372b may be formed of aluminum, copper, tungsten, or the like.

The memory cell region CELL may include at least one memory block. The memory cell region CELL may include a second substrate 2310 and a common source line 2320. On the second substrate 2310, a plurality of word lines 2331 to 2338 (i.e., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

In the bit line bonding area BLBA, a channel structure CH may extend in a direction, perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an example embodiment, the bit line 2360c may extend in a first direction (a Y-axis direction), parallel to the upper surface of the second substrate 2310.

In an example embodiment illustrated in FIG. 29, an area in which the channel structure CH, the bit line 2360c, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. For example, the bit line 2360c may be connected to upper bonding metals 2371c and 2372c in the memory cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (an X-axis direction), parallel to the upper surface of the second substrate 2310, and may be connected to a plurality of cell contact plugs 2341 to 2347 (i.e., 2340). The plurality of word lines 2330 and the plurality of cell contact plugs 2340 may be connected to each other in pads provided by at least a portion of the plurality of word lines 2330 extending in different lengths in the second direction. A first metal layer 2350b and a second metal layer 2360b may be connected to an upper portion of the plurality of cell contact plugs 2340 connected to the plurality of word lines 2330, sequentially. The plurality of cell contact plugs 2340 may be connected to the circuit region PERI by the upper bonding metals 2371b and 2372b of the memory cell region CELL and the lower bonding metals 2271b and 2272b of the peripheral circuit region PERI in the word line bonding area WLBA.

The plurality of cell contact plugs 2340 may be electrically connected to the circuit elements 2220b providing the row decoder 2394 in the peripheral circuit region PERI. In an example embodiment, operating voltages of the circuit elements 2220b providing the row decoder 2394 may be different than operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input-output pads 2205 and 2305 may be disposed in the external pad bonding area PA. Referring to FIG. 29, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 29, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303.

According to embodiments, the second substrate 2310 and the common source line 320 may not be disposed in an area in which the second input-output contact plug 2303 is disposed. Also, the second input-output pad 2305 may not overlap the word lines 2330 in the third direction (the Z-axis direction). Referring to FIG. 29, the second input-output contact plug 2303 may be separated from the second substrate 2310 in a direction, parallel to the upper surface of the second substrate 2310, and may pass through the interlayer insulating layer 2315 of the memory cell region CELL to be connected to the second input-output pad 2305.

According to embodiments, the first input-output pad 2205 and the second input-output pad 2305 may be selectively formed. For example, the memory device 2000 may include only the first input-output pad 2205 disposed on the first substrate 2210 or the second input-output pad 2305 disposed on the second substrate 2310. Alternatively, the memory device 2000 may include both the first input-output pad 2205 and the second input-output pad 2305.

A metal pattern in an uppermost metal layer may be provided as a dummy pattern or the uppermost metal layer may be absent, in each of the external pad bonding area PA and the bit line bonding area BLBA, respectively included in the memory cell region CELL and the peripheral circuit region PERI.

In the external pad bonding area PA, the memory device 2000 may include a lower metal pattern 2273a, corresponding to an upper metal pattern 2372a formed in an uppermost metal layer of the memory cell region CELL, and having the same shape as the upper metal pattern 2372a of the memory cell region CELL, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the memory cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the memory cell region CELL by a Cu—Cu bonding.

Further, the bit line bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the memory cell region CELL. A contact may not be formed on the upper metal pattern 2392 formed in the uppermost metal layer of the memory cell region CELL.

In an example embodiment, corresponding to a metal pattern formed in an uppermost metal layer in one of the memory cell region CELL and the peripheral circuit region PERI, a reinforcement metal pattern having the same shape as the metal pattern may be formed in an uppermost metal layer in another one of the memory cell region CELL and the peripheral circuit region PERI, and a contact may not be formed on the reinforcement metal pattern.

As described above, according to example embodiments, a memory device may include a peripheral circuit region and a cell region disposed above the peripheral circuit region. The cell region may have a cell array region, in which channel structures are disposed, and contact regions in which cell contacts connected to wordlines are disposed. The contact regions may extend from a cell array region in directions, parallel to an upper surface of a substrate in which the cell region is formed, and may have lengths different from each other in at least one of the directions, parallel to the upper surface of the substrate. In addition, at least a portion of the cell contacts may share pass elements formed in the peripheral circuit region. Thus, integration density of the memory device may be increased.

While example embodiments have been shown and described above, it will be apparent to those skilled in the art that modifications and variations could be made without departing from the scope of the present inventive concept as defined by the appended claims.

What is claimed is:

1. A memory device, comprising:
a peripheral circuit region including a row decoder and a page buffer; and
a cell region including a plurality of wordlines stacked to each other, a plurality of channel structures penetrating the plurality of wordlines, and a plurality of cell contacts connected to the plurality of wordlines, the plurality of cell contacts are disposed in a first cell contact region and a second cell contact region,
wherein the first cell contact region and the second cell contact region are disposed on both sides of the plurality of channel structures, in a first direction,
the cell region and the peripheral circuit region are stacked in a vertical direction in which the plurality of channel structures are extended,
each of the first cell contact region and the second cell contact region has a plurality of first pads and a plurality of second pads,
in the first direction, a length of each of the plurality of first pads is shorter than a length of each of the plurality of second pads, and
an area of at least one of the plurality of second pads included in the first cell contact region is greater than an area of at least one of the plurality of second pads included in the second cell contact region.

2. The memory device of claim 1, wherein a length of the first cell contact is longer than a length of the second cell contact, in the first direction.

3. The memory device of claim 1, wherein the row decoder includes a plurality of first pass elements and a plurality of second elements connected to the plurality of wordlines,
a portion of the plurality of wordlines are connected to the plurality of first pass elements and a remainder of the plurality of wordlines are connected to the plurality of second elements, and
each of the plurality of first pass elements is connected to one of the portion of the plurality of wordiness and each of the plurality of second pass elements is connected to one of the remainder of the plurality of wordlines.

4. The memory device of claim 3, wherein the plurality of second pass elements are disposed between the plurality of first pass elements, in the first direction.

5. The memory device of claim 3, wherein the number of the portion of the plurality of wordlines is greater than the number of the remainder of the plurality of wordlines.

6. The memory device of claim 3, wherein the cell region includes a first cell region and a second cell region adjacent to each other, in the first direction, and
at least one of the plurality of second pass elements is disposed between the first cell region and the second cell region, in the first direction.

7. The memory device of claim 3, wherein the cell region includes a first cell region and a second cell region adjacent to each other, in the first direction, and
at least one of the plurality of second pass elements is disposed under a boundary region between the first cell region and the second cell region in the first direction.

8. The memory device of claim 7, wherein the plurality of wordlines are not disposed over the at least one of the plurality of second pass element, in the vertical direction.

9. The memory device of claim 7, wherein the at least one of the plurality of second pass element is connected to two or more of the remainder of the plurality of wordlines, by at least one vertical via extending in the vertical direction, and
in the vertical direction, a length of the at least one vertical via is longer than a length of each of the plurality of cell contacts.

10. The memory device of claim 9, wherein, in the vertical direction, the length of the at least one vertical via is longer than a length of each of the plurality of channel structures.

11. The memory device of claim 1, wherein the number of the plurality of second pads included in the first cell contact region is greater than the number of the plurality of second pads included in the second cell contact region.

12. A memory device, comprising:
a plurality of cell regions, each of the plurality of cell regions including a plurality of wordlines stacked in a vertical direction and extending in a first direction and a plurality of channel structures extending in the vertical direction and penetrating the plurality of wordlines; and
a peripheral circuit region including a plurality of pass elements, and disposed under the plurality of cell regions in the vertical direction,
wherein each of the plurality of cell regions includes a first cell region and a second cell region arranged in the first direction,
at least one pass element of the plurality of pass elements is disposed in a boundary region between the first cell region and the second cell region, and is connected to at least one vertical via crossing a boundary between the peripheral circuit region and the plurality of cell regions, and
the at least one vertical via is commonly connected to at least one of the plurality of wordlines included in the first cell region and at least one of the plurality of wordiness included in the second cell region.

13. The memory device of claim 12, wherein the at least one of the plurality of wordlines included in the first cell region and the at least one of the plurality of wordiness included in the second cell region are disposed at the same height, in the vertical direction.

14. The memory device of claim 12, wherein the first cell region and the second region have a symmetrical structure, with respect to the boundary region.

15. The memory device of claim 12, wherein each of the first cell region and the second region includes a cell array region in which the plurality of channel structures are disposed and a first cell contact region and a second cell contact region disposed on both sides of the cell array region in the first direction, and
in the first direction, the boundary region is disposed between the second cell contact region of the first cell region and the second cell contact region of the second cell region.

16. The memory device of claim 15, wherein a length of the second cell contact region is shorter than a length of the first cell contact region, in the first direction.

17. The memory device of claim 15, wherein each the at least one of the plurality of wordlines included in the first cell region and the at least one of the plurality of wordlines included in the second cell region is commonly connected to the at least one vertical via by cell contacts disposed in the second cell contact region.

* * * * *